US012796422B2

(12) United States Patent
Lin

(10) Patent No.: US 12,796,422 B2
(45) Date of Patent: Nov. 10, 2026

(54) SEMICONDUCTOR DEVICE WITH POROUS LAYER AND METHOD FOR FABRICATING THE SAME

(71) Applicant: NANYA TECHNOLOGY CORPORATION, New Taipei City (TW)

(72) Inventor: Yuan-Yuan Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 308 days.

(21) Appl. No.: 18/742,120

(22) Filed: Jun. 13, 2024

(65) Prior Publication Data

US 2025/0385129 A1 Dec. 18, 2025

(51) Int. Cl.

| | |
|---|---|
| ***H10W 20/00*** | (2026.01) |
| ***H10W 20/41*** | (2026.01) |
| ***H10W 20/42*** | (2026.01) |
| ***H10W 20/43*** | (2026.01) |

(52) U.S. Cl.

CPC ....... *H10W 20/033* (2026.01); *H10W 20/076* (2026.01); *H10W 20/42* (2026.01); *H10W 20/425* (2026.01); *H10W 20/43* (2026.01)

(58) Field of Classification Search

CPC ........... H10W 20/0633; H10W 20/063; H10W 20/425; H10W 20/077; H10W 20/47; H10W 20/037

See application file for complete search history.

(56) References Cited

U.S. PATENT DOCUMENTS

| | | | | |
|---|---|---|---|---|
| 6,465,343 | B1 * | 10/2002 | Wang | H10P 50/71 438/626 |
| 2012/0025395 | A1 * | 2/2012 | Chikaki | H10P 14/6342 257/774 |
| 2019/0244896 | A1 * | 8/2019 | Lee | H10P 14/6339 |
| 2023/0231027 | A1 * | 7/2023 | Kim | H10D 64/0112 257/384 |
| 2025/0300066 | A1 * | 9/2025 | van der Straten | H10W 20/036 |

* cited by examiner

*Primary Examiner* — Alia Sabur

(74) *Attorney, Agent, or Firm* — Xuan Zhang

(57) ABSTRACT

The present application discloses a semiconductor device and a method for fabricating the semiconductor device. The semiconductor device includes a substrate; a bottom interconnector layer positioned in the substrate; a bottom dielectric layer positioned on the substrate; an interconnector structure positioned along the bottom dielectric layer, positioned on the bottom interconnector layer, and positioned on the bottom dielectric layer; a plurality of liners laterally positioned between the bottom dielectric layer and the interconnector structure and vertically positioned between the interconnector structure and the bottom interconnector layer; a top glue layer conformally positioned on the bottom dielectric layer and the interconnector structure; a top dielectric layer positioned surrounding the top glue layer. A top surface of the top glue layer and a top surface of the top dielectric layer are substantially coplanar. The top dielectric layer is porous.

16 Claims, 41 Drawing Sheets

SEMICONDUCTOR DEVICE WITH POROUS LAYER AND METHOD FOR FABRICATING THE SAME

TECHNICAL FIELD

The present disclosure relates to a semiconductor device and a method for fabricating the semiconductor device, and more particularly, to a semiconductor device with a porous layer and a method for fabricating the semiconductor device with the porous layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a bottom interconnector layer positioned in the substrate; a bottom dielectric layer positioned on the substrate; an interconnector structure positioned along the bottom dielectric layer, positioned on the bottom interconnector layer, and positioned on the bottom dielectric layer; a plurality of liners laterally positioned between the bottom dielectric layer and the interconnector structure and vertically positioned between the interconnector structure and the bottom interconnector layer; a top glue layer conformally positioned on the bottom dielectric layer and the interconnector structure; a top dielectric layer positioned surrounding the top glue layer. A top surface of the top glue layer and a top surface of the top dielectric layer are substantially coplanar. The top dielectric layer is porous.

Another aspect of the present disclosure provides a semiconductor device including a substrate; a first capacitor unit including a bottom conductive structure inwardly positioned in the substrate, and a shared conductive layer positioned above the bottom conductive structure with a first insulating layer interposed therebetween; a second capacitor unit including the shared conductive layer, and a top conductive layer positioned above the shared conductive layer with a second insulating layer interposed therebetween; a top dielectric layer positioned on the second insulating layer and laterally surrounding the top conductive layer, wherein the top dielectric layer is porous; a conductive layer including a horizontal segment positioned in the top dielectric layer and a vertical segment downwardly extending from the horizontal segment towards the substrate, and electrically connecting to the bottom conductive structure; a plurality of liners laterally positioned adjacent to the vertical segment and vertically positioned between the horizontal segment and the bottom conductive structure; and a connection structure electrically connecting the conductive layer and the top conductive layer such that the first capacitor unit and the second capacitor unit are in parallel.

Another aspect of the present disclosure provides a method for fabricating a semiconductor device including providing a substrate and forming a bottom interconnector layer in the substrate; forming a bottom energy-removable layer on the substrate and forming a first recess in the bottom energy-removable layer to expose the bottom interconnector layer; forming a plurality of liners on sidewalls of the bottom energy-removable layer and within the first recess; forming an interconnector structure in the first recess and on the bottom energy-removable layer and the bottom interconnector layer; conformally forming a top glue layer on the bottom energy-removable layer and the interconnector structure; forming a top energy-removable layer laterally surrounding the top glue layer; performing an energy treatment to turn the bottom energy-removable layer into a bottom dielectric layer and turn the top energy-removable layer into a top dielectric layer. A top surface of the top glue layer and a top surface of the top dielectric layer are substantially coplanar. The top dielectric layer and the bottom dielectric layer are porous.

Due to the design of the semiconductor device of the present disclosure, the parasitic capacitance of the semiconductor device may be reduced by employing the top dielectric layer (and/or the bottom dielectric layer) having low dielectric constant. As a result, the performance of the semiconductor device may be improved. In addition, the barrier layer may prevent outgassing issues of the porous layers (i.e., the bottom dielectric layer and the top dielectric layer) to avoid the damage of the interconnector structure and to improve the reliability of the semiconductor device. Furthermore, the bottom glue layer and the top glue layer may also improve the adhesion of the bottom dielectric layer and the top dielectric layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
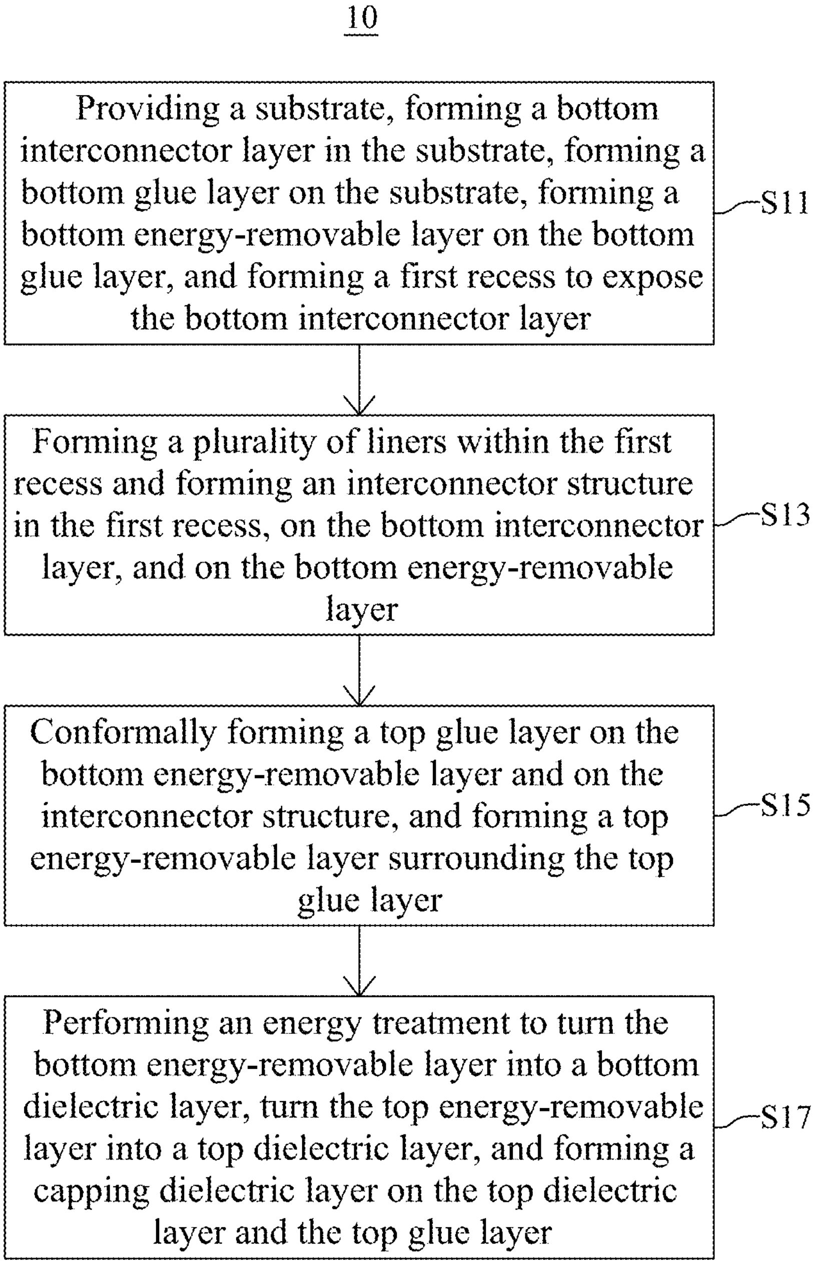
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 16 illustrate, in schematic cross-sectional view diagrams, a flow for fabricating the semiconductor device 1A in accordance with one embodiment of the present disclosure.

With reference to FIGS. 1 to 5, at step S11, a substrate 101 may be provided, a bottom interconnector layer 103 may be formed in the substrate 101, a bottom glue layer 201 may be formed on the substrate 101, a bottom energy-removable layer 501 may be formed on the bottom glue layer 201, and a first recess R1 may be formed to expose the bottom interconnector layer 103.

Figure 2:
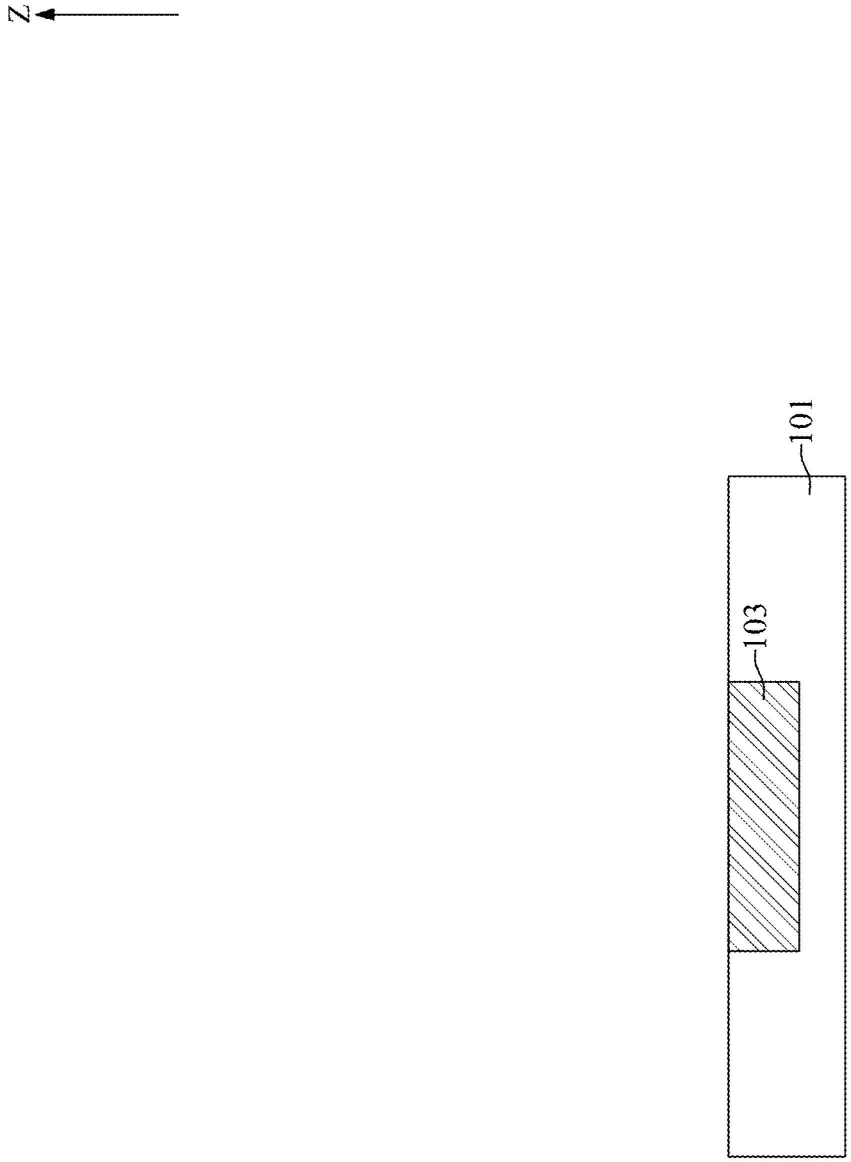
FIGS. 2 to 16 illustrate, in schematic cross-sectional view diagrams, a flow for fabricating the semiconductor device in accordance with one embodiment of the present disclosure.

With reference to FIG. 2, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive layers may together configure functional units of the semiconductor device 1A. A functional unit, in the description of the present disclosure, generally refers to functionally related circuitry that has been partitioned for functional purposes into a distinct unit. In some embodiments, the functional units of the semiconductor device 1A may include, for example, highly complex circuits such as processor cores, memory controllers, accelerator units, or other applicable functional circuitry.

With reference to FIG. 2, the bottom interconnector layer 103 may be referred to as part of the conductive features of the substrate 101. In some embodiments, the bottom interconnector layer 103 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the top surface of the substrate 101 and the top surface of the bottom interconnector layer 103 may be substantially coplanar.

Figure 3:
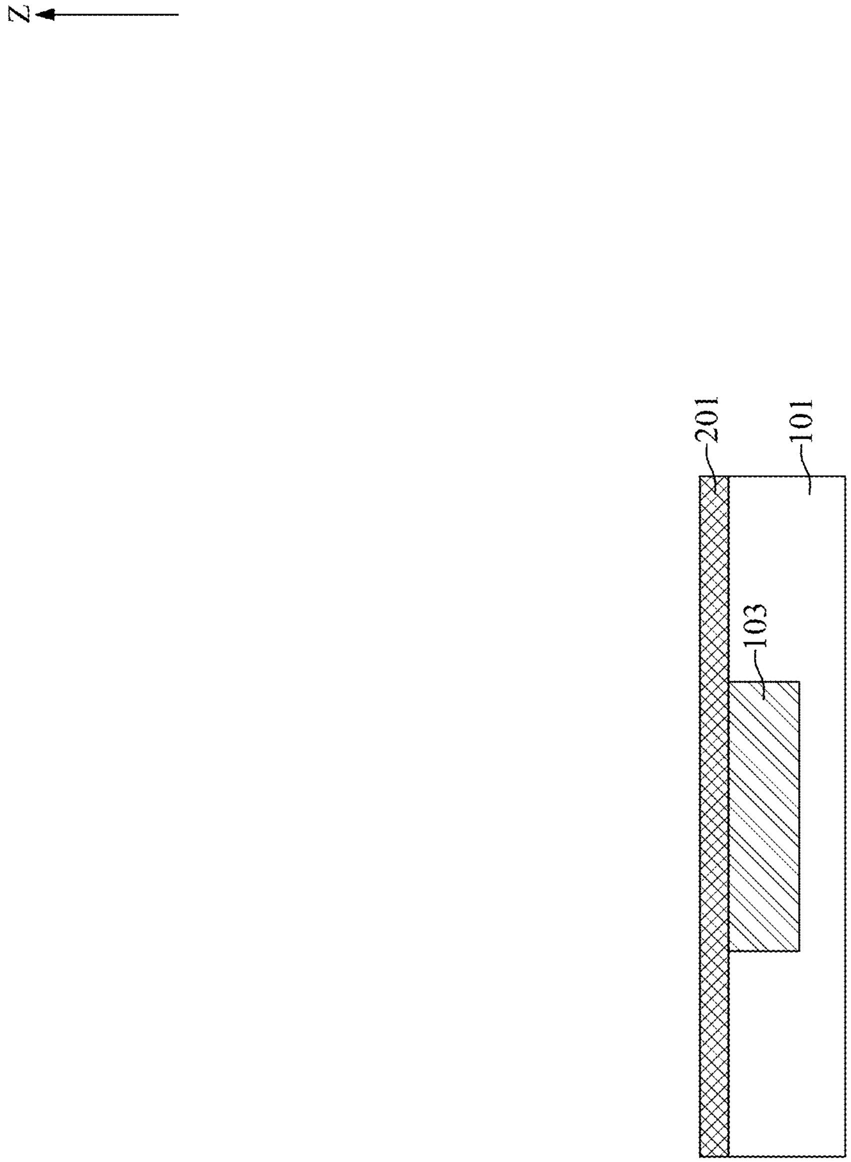

With reference to FIG. 3, the bottom glue layer 201 may be formed on the substrate 101. In some embodiments, the bottom glue layer 201 may be formed of a low porous dielectric material. For example, the porosity of the bottom glue layer 201 may be less than 5%, less than 4%, less than 3%, less than 2%, less than 1%, or 0%. In some embodiments, the bottom glue layer 201 may be formed of, for example, silicon oxide. In some embodiments, the bottom glue layer 201 may be formed of a material having etching selectivity to the bottom energy-removable layer 501 which will be illustrated later. In some embodiments, the bottom glue layer 201 may be formed of a material having etching selectivity to aluminum, copper, or tungsten. In some embodiments, the bottom glue layer 201 may be formed of, for example, silicon nitride, silicon oxynitride, silicon nitride oxide, or a combination thereof. In some embodiments, the bottom glue layer 201 may be formed by, for example, atomic layer deposition, chemical vapor deposition, plasma-enhanced chemical vapor deposition, or other applicable deposition processes. In some embodiments, the bottom glue layer 201 may improve the adhesion between the substrate 101 and the bottom energy-removable layer 501.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 4:
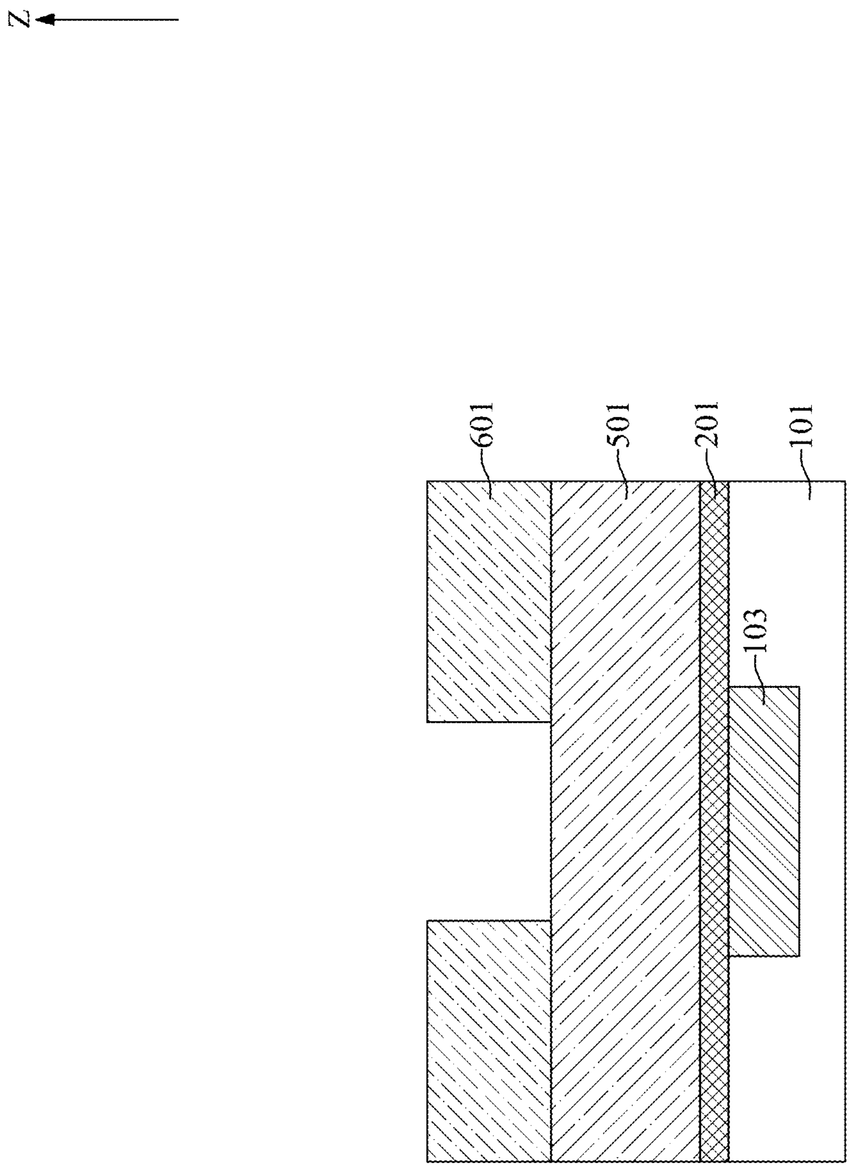

With reference to FIG. 4, the bottom energy-removable layer 501 may be formed on the bottom glue layer 201. In some embodiments, the bottom energy-removable layer 501 may include a material such as a thermal decomposable material, a photonic decomposable material, an e-beam decomposable material, or a combination thereof. For example, the bottom energy-removable layer 501 may include a base material and a decomposable porogen material that is sacrificially removed upon exposure to an energy source. The base material may include a methylsilsesquioxane based material. The decomposable porogen material may include a porogen organic compound that provides porosity to the base material of the bottom energy-removable layer 501.

In some embodiments, the bottom energy-removable layer 501 may include about 50% of the decomposable porogen material, and about 50% of the base material. In some embodiments, the bottom energy-removable layer 501 may include about 45% of the decomposable porogen material, and about 55% of the base material. In some embodiments, the bottom energy-removable layer 501 may include about 35% of the decomposable porogen material, and about 65% of the base material. In some embodiments, the bottom energy-removable layer 501 may include about 25% of the decomposable porogen material, and about 75% of the base material. In some embodiments, the bottom energy-removable layer 501 may include about 15% of the decomposable porogen material, and about 85% of the base material. In some embodiments, the bottom energy-removable layer 501 may include about 10% of the decomposable porogen material, and about 90% of the base material.

With reference to FIG. 4, a first mask layer 601 may be formed on the bottom energy-removable layer 501. In some embodiments, the first mask layer 601 may be a photoresist layer and may include a pattern of a first recess R1 which will be illustrated later. The pattern of the first mask layer 601 may be formed by performing a photolithography process. The un-patterned first mask layer 601 (not shown in FIG. 4) may be exposed to process light according to a mask (not shown in FIG. 4). A wavelength of the process light may be associated with the critical dimension of the pattern. In some embodiments, the process light may be a deep ultraviolet (DUV). In some embodiments, the process light may be an extreme ultraviolet (EUV), and the photolithography process may be an EUV lithography. After exposing the process light, a pattern on the mask is converted to the un-patterned first mask layer 601. The un-patterned first mask layer 601 may be then etched according to the converted pattern so as to form the pattern on the first mask layer 601.

Figure 5:
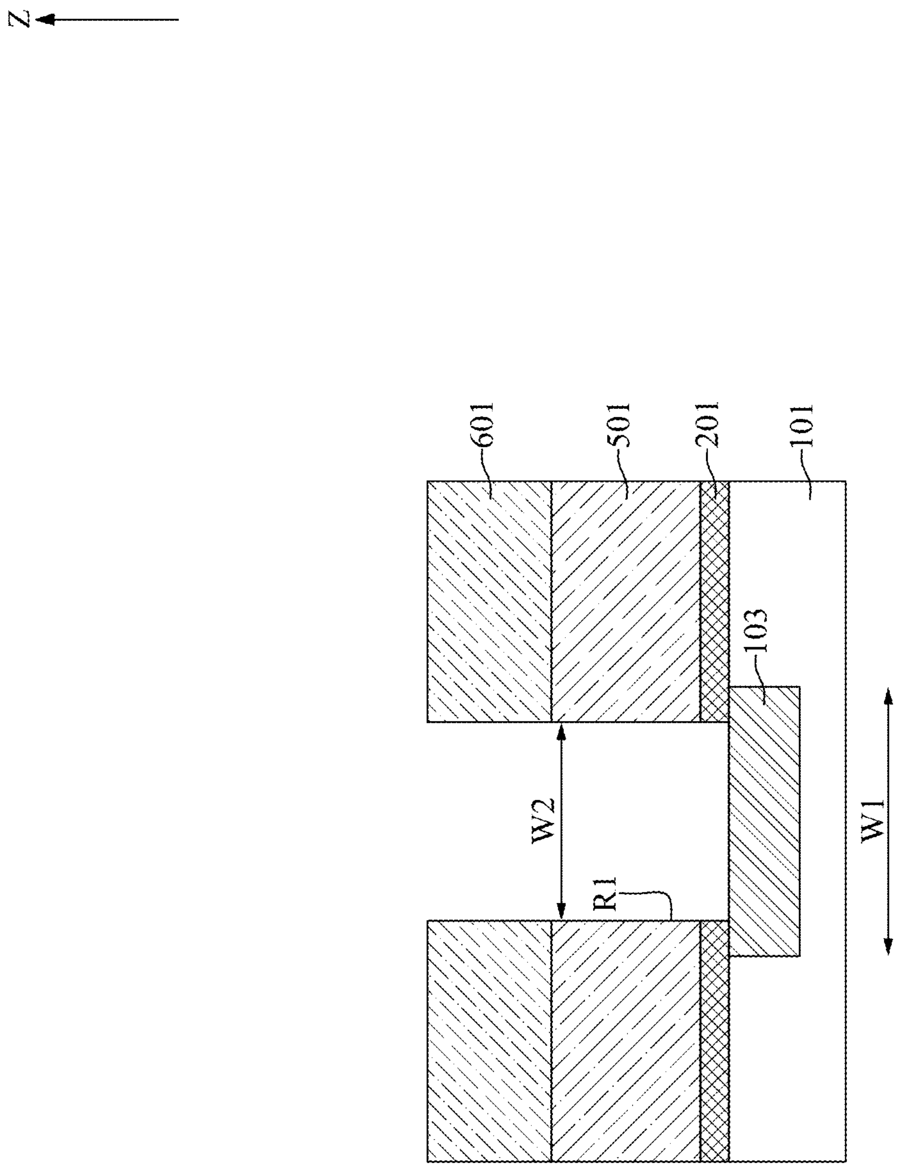

With reference to FIG. 5, a first recess etching process may be performed to remove portions of the bottom energy-removable layer 501 and the bottom glue layer 201. In some embodiments, the first recess etching process may be a multi-stage etching process. For example, the first recess etching process may be a two-stage anisotropic dry etching process. The etching chemistry may be different for each stage to provide different etching selectivity.

With reference to FIG. 5, after the first recess etching process, the first recess R1 may be formed along the bottom energy-removable layer 501 and the bottom glue layer 201. The bottom interconnector layer 103 may be partially exposed through the first recess R1. In some embodiments, the width W2 of the first recess R1 may be less than the width W1 of the bottom interconnector layer 103. After the formation of the first recess R1, the first mask layer 601 may be removed.

With reference to FIG. 1 and FIGS. 6 to 11, at step S13, a plurality of liners 407 may be formed within the first recess R1 and an interconnector structure 400 may be formed in the first recess R1, on the bottom interconnector layer 103, and on the bottom energy-removable layer 501.

Figure 6:
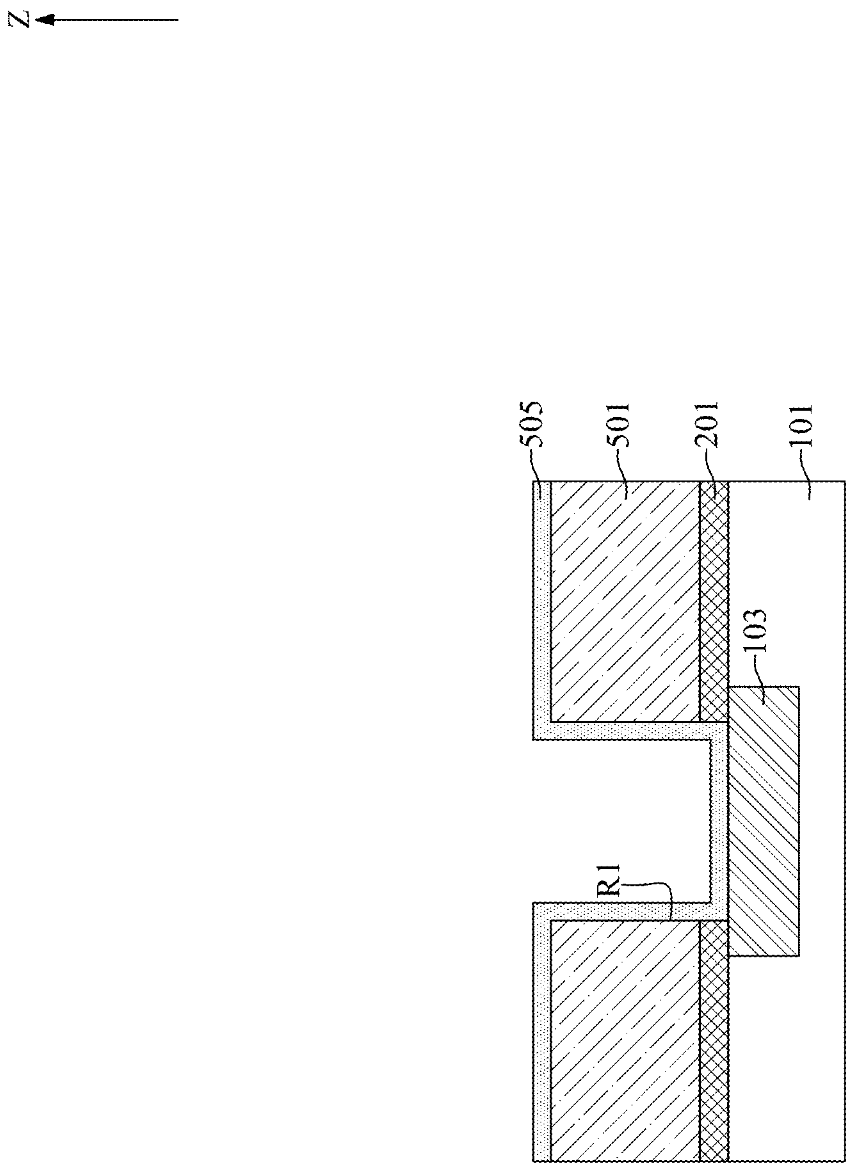

With reference to FIG. 6, a layer of barrier material 505 may be conformally formed in the first recess R1, on the bottom interconnector layer 103, and on the bottom energy-removable layer 501. In some embodiments, the barrier material 505 may include, for example, titanium, titanium nitride, tantalum, tantalum nitride, or a combination thereof. In some embodiments, the barrier material 505 may be formed by, for example, chemical vapor deposition, atomic layer deposition, plasma-enhanced chemical vapor deposition, or other applicable deposition processes. In some embodiments, the layer of barrier material 505 may be optional.

Figure 7:
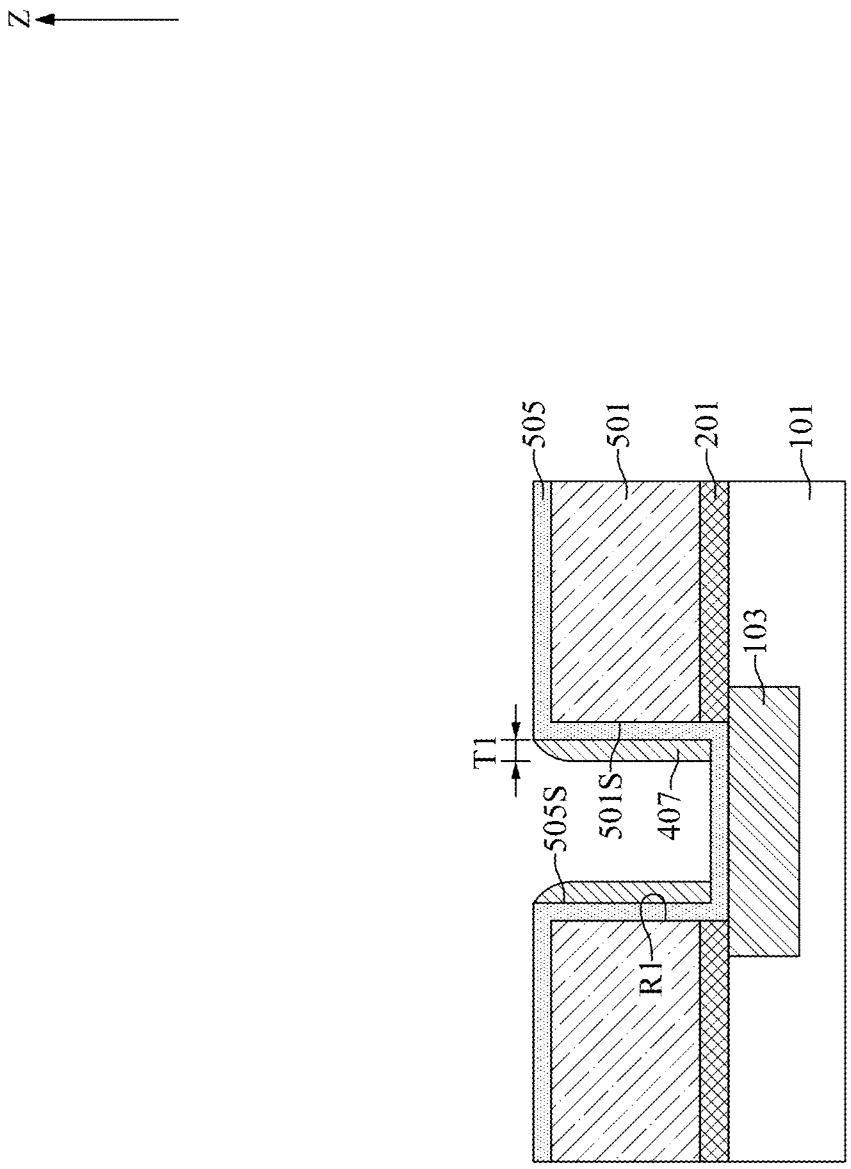

With reference to FIG. 7, the liners 407 may be formed within the first recess R1 and on sidewalls 505S of the layer of barrier material 505, respectively and correspondingly. Alternatively, in some embodiments, when the layer of barrier material 505 is omitted, the liners 407 may be formed on the sidewalls 501S of the first recess R1, respectively and correspondingly. In some embodiments, the thickness T1 of the liners 407 may be about 1.0 μm to about 10 μm. In some embodiments, the thickness T1 of the liners 407 may be about 10 nm to 100 nm. In some embodiments, the liners 407 may be formed of, for example, titanium, titanium nitride, titanium-tungsten alloy, tantalum, tantalum nitride, or the combination thereof. In some embodiments, the liners 407 may be formed by conformally depositing a liner material (not shown) with a subsequent anisotropic etching process.

Figure 8:
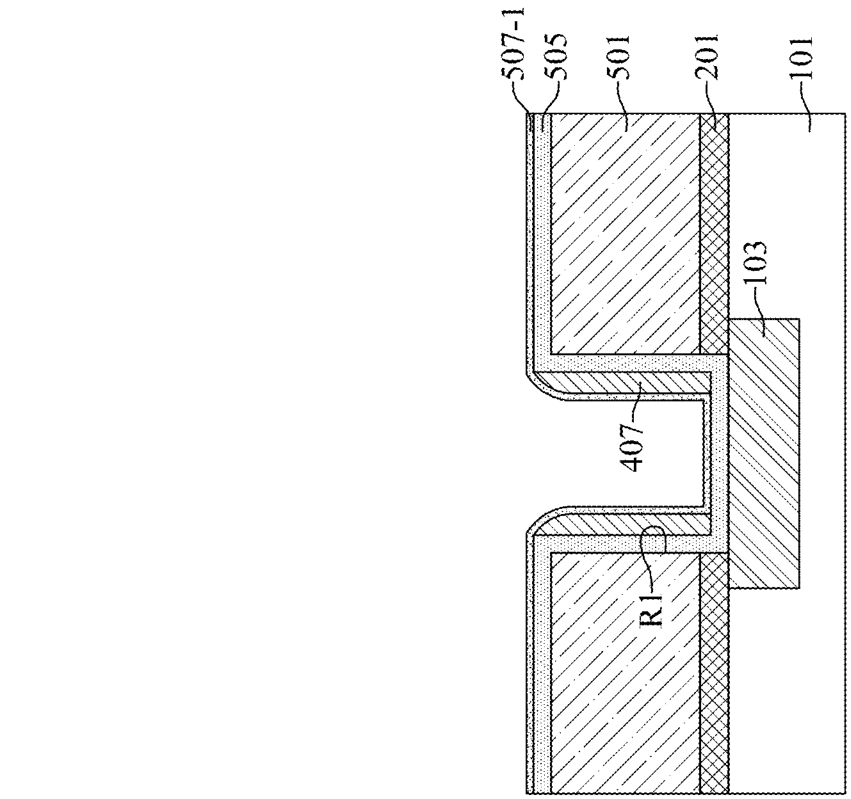
Figure 9:
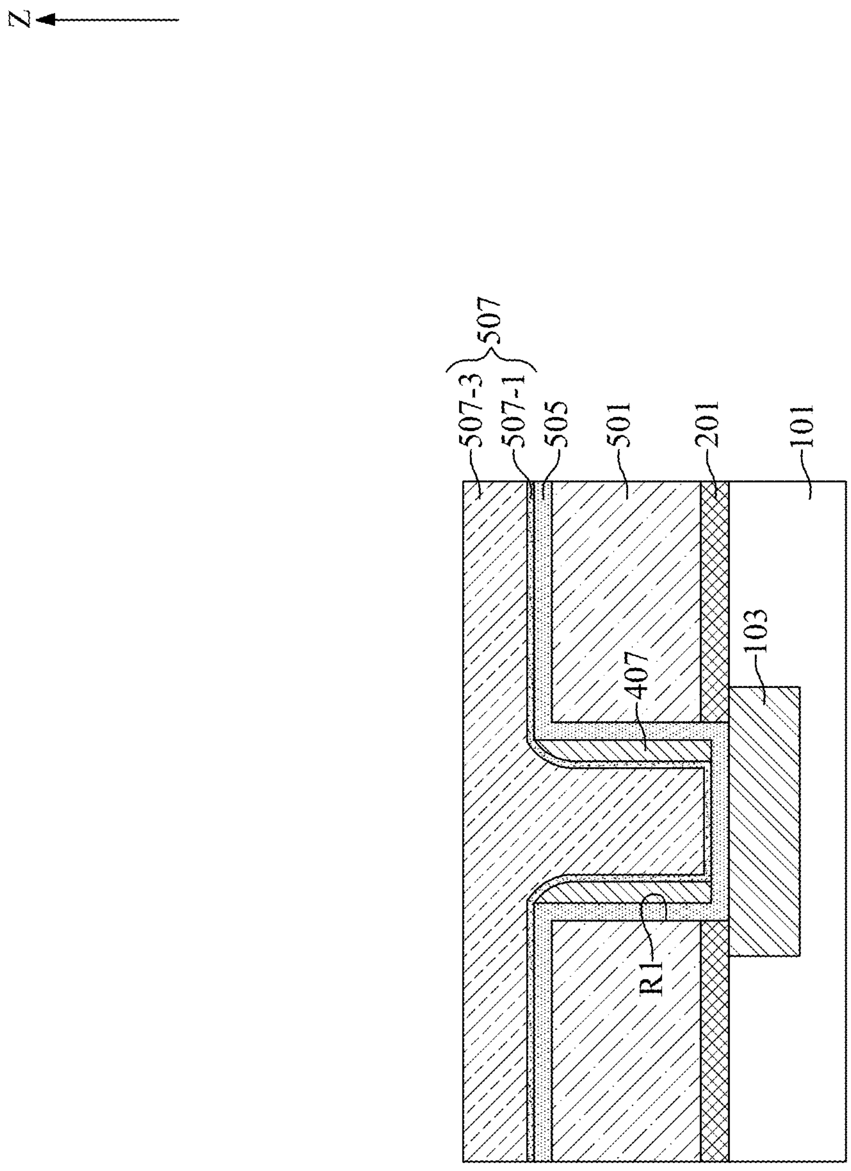

With reference to FIGS. 8 and 9, a nucleation portion 507-1 may be conformally formed on the plurality of liners 407 and on the layer of barrier material 505 and a bulk portion 507-3 may be formed on the nucleation portion 507-1, wherein the nucleation portion 507-1 and the bulk portion 507-3 together configure a layer of conductive material 507.

In some embodiments, the conductive material 507 may include tungsten. Tungsten may be particularly useful in gate electrodes and word and bit lines in dynamic random access memory types of integrated circuit devices because of its thermal stability during subsequent high temperature processes, where processing temperatures may reach 900° C. or more. Additionally, tungsten is a highly refractive material which offers good oxidation resistance and lower resistivity.

With reference to FIG. 8, in some embodiments, the nucleation portion 507-1 may be a thin conformal layer that serves to facilitate the subsequent formation of a bulk material (i.e., the bulk portion 507-3) thereon. Conforming to the liners 407 and the layer of barrier material 505 may be critical to support high quality deposition. In some embodiments, the nucleation portion 507-1 may be formed by a pulsed nucleation layer method.

With reference to FIG. 9, the bulk portion 507-3 may be formed on the nucleation portion 507-1 and completely fill the first recess R1. The bulk portion 507-3 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or a combination thereof.

For example, the deposition of the bulk portion 507-3 using chemical vapor deposition may include flowing (or introducing) a tungsten-containing precursor and a co-reactant such as a reducing agent to the intermediate semiconductor device including the nucleation portion 507-1. Example process pressure may be between about 10 Torr and about 500 Torr. Example substrate temperature may be between about 250° C. and about 495° C. The tungsten-containing precursor may be, for example, tungsten hexafluoride, tungsten chloride, or tungsten hexacarbonyl. The reducing agent may be, for example, hydrogen gas, silane, disilane, hydrazine, diborane, or germane.

In some embodiments, the grain size of tungsten of the bulk portion 507-3 may be greater than 30 nm, than 50 nm, than 70 nm, than 80 nm, than 85 nm, or than 87 nm. In some embodiments, the bulk portion 507-3 may include alpha phase tungsten.

A planarization process, such as chemical mechanical polishing, may be performed on the layer of conductive material 507 to provide a substantially flat surface for subsequent processing steps.

Figure 10:
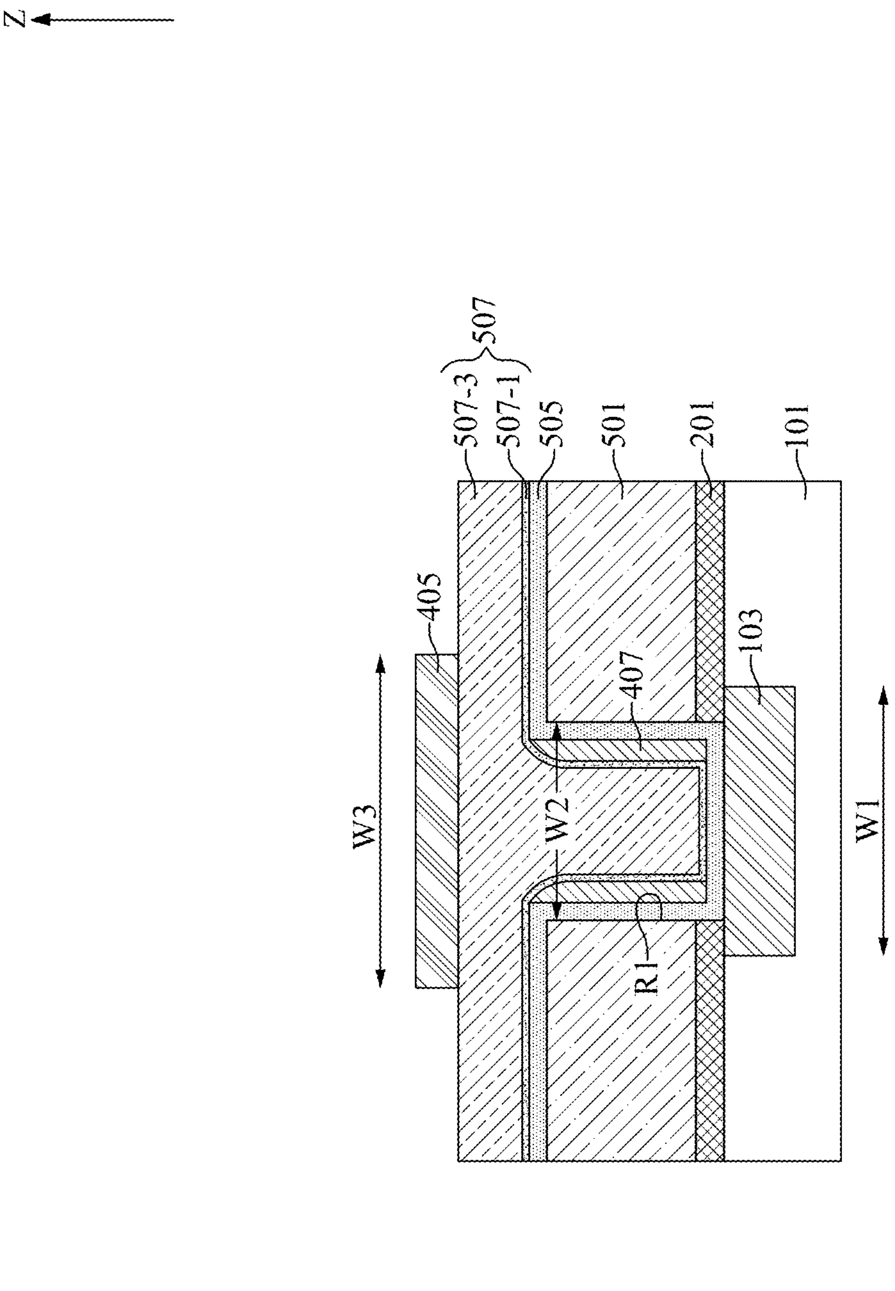

With reference to FIG. 10, a hard mask layer 405 may be formed on the layer of conductive material 507. In some embodiments, the width W3 of the hard mask layer 405 may be greater than the width W1 of the bottom interconnector layer 103. In some embodiments, the width W3 of the hard mask layer 405 and the width W1 of the bottom interconnector layer 103 may be substantially the same. In some embodiments, the width W3 of the hard mask layer 405 may be greater than the width W2 of the first recess R1.

In some embodiments, the hard mask layer 405 may be formed of, for example, a material having etching selectivity to the conductive material 507 or the barrier material 505. In some embodiments, the hard mask layer 405 may be formed of, for example, silicon, silicon germanium, tetraethyl orthosilicate, silicon nitride, silicon oxynitride, silicon nitride oxide, silicon carbide, the like, or a combination thereof. In some embodiments, the hard mask layer 405 may be formed by a deposition process such as chemical vapor deposition, plasma-enhanced chemical vapor deposition, or atomic layer deposition, with a photolithography process and anisotropic etching process. The process temperature of forming the hard mask layer 405 may be less than 400° C.

In some embodiments, the hard mask layer 405 may be formed of, for example, boron nitride, silicon boron nitride, phosphorus boron nitride, boron carbon silicon nitride, or the like.

Figure 11:
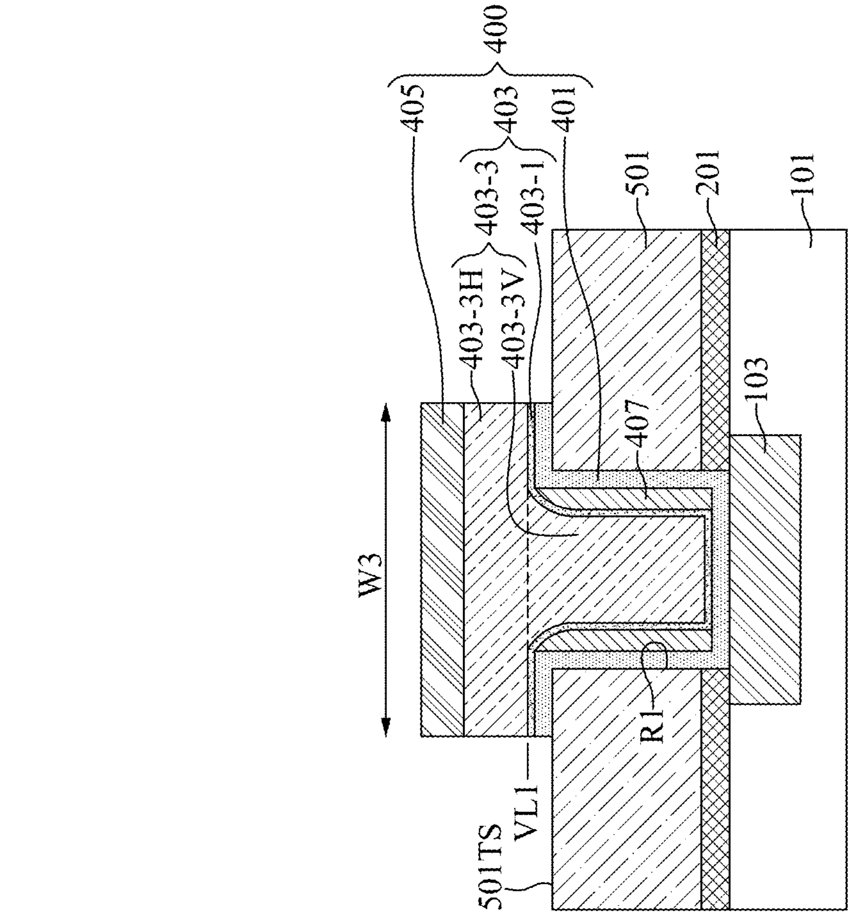

With reference to FIG. 11, a first etching process may be performed using the hard mask layer 405 as the mask to remove portions of the conductive material 507 and the barrier material 505. In some embodiments, the first etching process may be a multi-stage etching process. For example, the first etching process may be a two-stage anisotropic dry etching process. The etching chemistry may be different for each stage to provide different etching selectivity.

With reference to FIG. 11, after the first etching process, the remaining conductive material 507 may be referred to as the conductive layer 403. The remaining barrier material 505 may be referred to as the barrier layer 401. The barrier layer 401, the conductive layer 403, and the hard mask layer 405 together configure the interconnector structure 400. The interconnector structure 400 may be formed on the bottom interconnector layer 103 and on the bottom energy-removable layer 501.

With reference to FIG. 11, the conductive layer 403 may include a nucleation portion 403-1 and a bulk portion 403-3. The nucleation portion 403-1 of the conductive layer 403 may be formed from the nucleation portion 507-1 of the layer of conductive material 507. The bulk portion 403-3 of the conductive layer 403 may be formed from the bulk portion 507-3 of the layer of conductive material 507.

With reference to FIG. 11, the bulk portion 403-3 may include a vertical segment 403-3V and a horizontal segment 403-3H. The vertical segment 403-3V may be disposed on the bottom interconnector layer 103, laterally surrounded by the liners 407, and within the first recess R1. The top part of the vertical segment 403-3V may protrude from the top surface 501TS of the bottom energy-removable layer 501. State differently, the top surface of the vertical segment 403-3V may be at a vertical level VL1 higher than the top surface 501TS of the bottom energy-removable layer 501. The bottom part of the vertical segment 403-3V may be laterally surrounded by the liners 407. In some embodiments, the width W4 of the vertical segment 403-3V may be less than the width W3 of the hard mask layer 405.

With reference to FIG. 11, the horizontal segment 403-3H may be disposed on the vertical segment 403-3V. In some embodiments, the horizontal segment 403-3H may have the same width W3 as the hard mask layer 405. In some embodiments, the width W3 of the horizontal segment 403-3H may be greater than the width W4 of the vertical segment 403-3V. That is, the bulk portion 403-3 may have a T-shaped cross-sectional profile.

With reference to FIG. 11, the barrier layer 401 may be conformally disposed between the horizontal segment 403-3H and the bottom energy-removable layer 501, between the liners 407 and the bottom energy-removable layer 501, between the liners 407 and the bottom glue layer 201, and between the vertical segment 403-3V and the bottom interconnector layer 103. The barrier layer 401 may improve the adhesion between elements. The barrier layer 401 may also prevent the metal ion diffusing from the conductive layer 403 to the bottom energy-removable layer 501 or the substrate 101.

With reference to FIG. 11, the nucleation portion 403-1 may be conformally disposed between the horizontal segment 403-3H and the bottom energy-removable layer 501, between the vertical segment 403-3V and the liners 407, and between the vertical segment 403-3V and the bottom interconnector layer 103.

In some embodiments, the barrier layer 401 may be omitted. That is, the vertical segment 403-3V and the bottom energy-removable layer 501 (and the bottom glue layer 201) may be separated by the liners 407. The horizontal segment 403-3H may be disposed on the top surface 501TS of the bottom energy-removable layer 501.

With reference to FIG. 1 and FIGS. 12 to 14, at step S15, a top glue layer 203 may be conformally formed on the bottom energy-removable layer 501 and on the interconnector structure 400, and a top energy-removable layer 503 may be formed surrounding the top glue layer 203.

Figure 12:
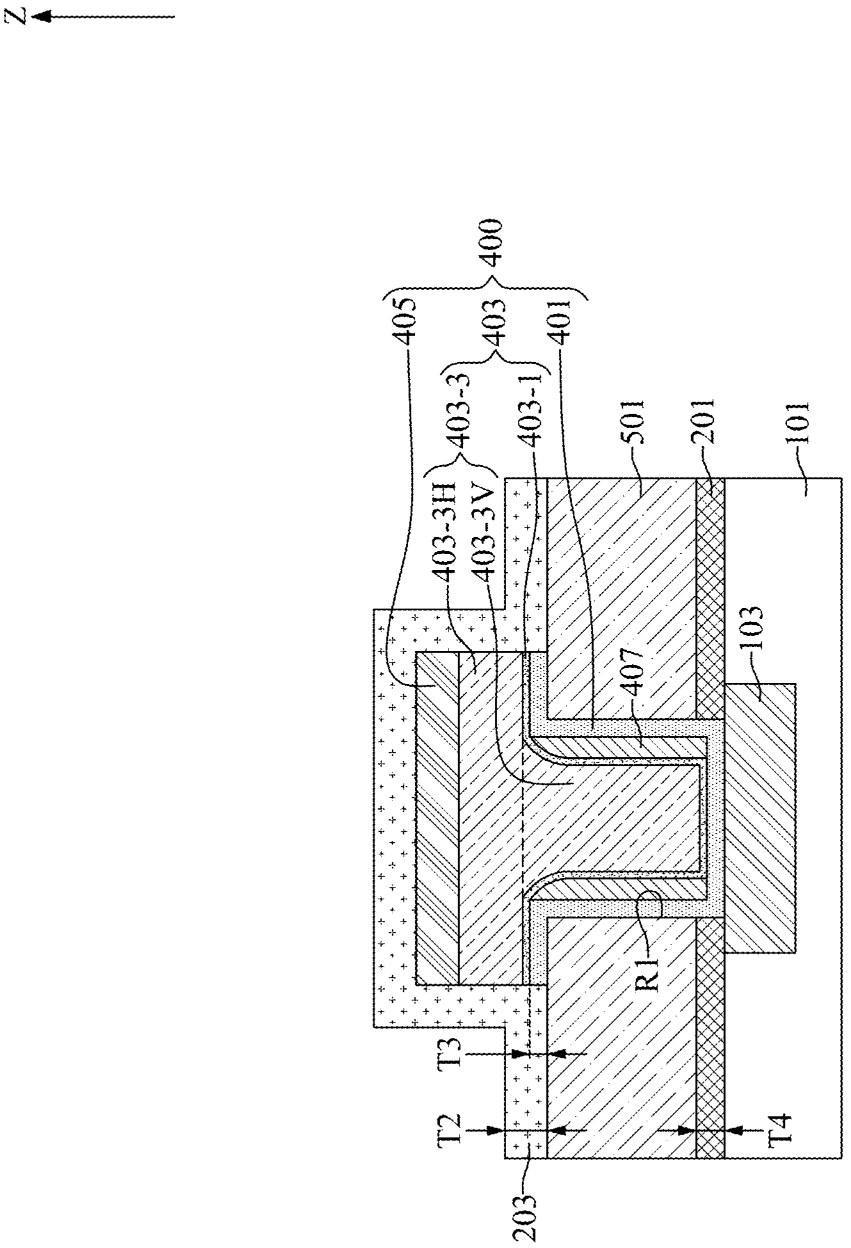

With reference to FIG. 12, the top glue layer 203 may be conformally formed on the bottom energy-removable layer 501 and covering the interconnector structure 400. In some embodiments, the thickness T2 of the top glue layer 203 may be greater than the thickness T3 of the barrier layer 401. In some embodiments, the thickness T2 of the top glue layer 203 and the thickness T3 of the barrier layer 401 may be substantially the same. In some embodiments, the thickness T2 of the top glue layer 203 may be greater than the thickness T4 of the bottom glue layer 201. In some embodiments, the thickness T2 of the top glue layer 203 may be less than the thickness T4 of the bottom glue layer 201. In some embodiments, the thickness T2 of the top glue layer 203 and the thickness T4 of the bottom glue layer 201 may be substantially the same.

In some embodiments, the top glue layer 203 may be formed of a low porous dielectric material. For example, the porosity of the top glue layer 203 may be less than 5%, less than 4%, less than 3%, less than 2%, less than 1%, or 0%. In some embodiments, the top glue layer 203 may be formed of, for example, silicon oxide. In some embodiments, the top glue layer 203 may be formed of a material having etching selectivity to the bottom energy-removable layer 501. In some embodiments, the top glue layer 203 may be formed of a material having etching selectivity to aluminum, copper, or tungsten. In some embodiments, the top glue layer 203 may be formed of, for example, silicon nitride, silicon oxynitride, silicon nitride oxide, or a combination thereof. In some embodiments, the top glue layer 203 may be formed by, for example, atomic layer deposition, chemical vapor deposition, plasma-enhanced chemical vapor deposition, or other applicable deposition processes. In some embodiments, the top glue layer 203 and the bottom glue layer 201 may be formed of the same material but is not limited thereto. In some embodiments, the top glue layer 203 may improve the adhesion between the bottom energy-removable layer 501 and a top energy-removable layer 503 which will be illustrated later. In some embodiments, the top glue layer 203 may also improve the adhesion between the interconnector structure 400 and the top energy-removable layer 503.

Figure 13:
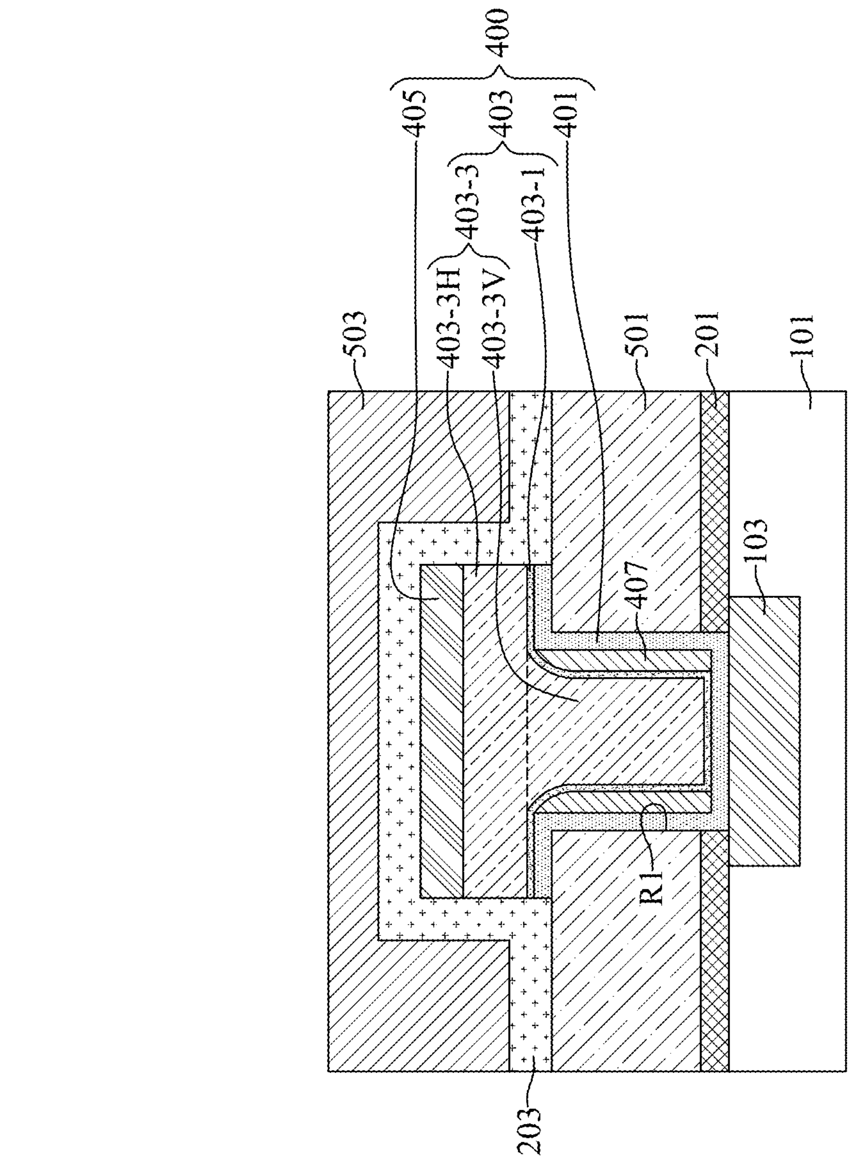

With reference to FIG. 13, a top energy-removable layer 503 may be formed on the top glue layer 203. In some embodiments, the top energy-removable layer 503 may include a material such as a thermal decomposable material, a photonic decomposable material, an e-beam decomposable material, or a combination thereof. For example, the top energy-removable layer 503 may include a base material and a decomposable porogen material that is sacrificially removed upon exposure to an energy source. The base material may include a methylsilsesquioxane based material. The decomposable porogen material may include a porogen organic compound that provides porosity to the base material of the top energy-removable layer 503.

In some embodiments, the ratio of the base material of the top energy-removable layer 503 may be less than the ratio of the base material of the bottom energy-removable layer 501. In some embodiments, the top energy-removable layer 503 may include about 55% of the decomposable porogen material, and about 45% of the base material. In some embodiments, the top energy-removable layer 503 may include about 65% of the decomposable porogen material, and about 35% of the base material. In some embodiments, the top energy-removable layer 503 may include about 75% of the decomposable porogen material, and about 25% of the base material. In some embodiments, the top energy-removable layer 503 may include about 85% of the decomposable porogen material, and about 15% of the base material.

Figure 14:
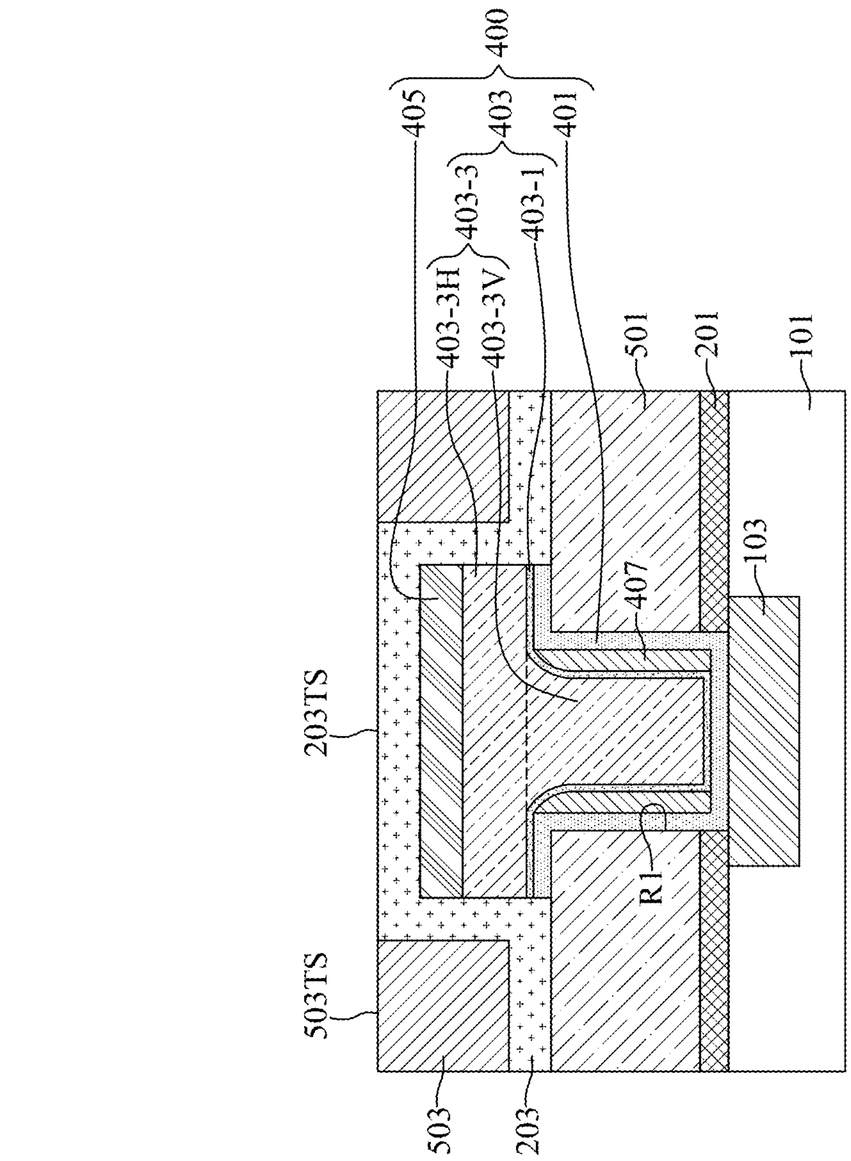

With reference to FIG. 14, a planarization process, such as chemical mechanical polishing, may be performed until the top surface 203TS of the top glue layer 203 is exposed to remove excess material and provide a substantially flat surface for subsequent processing steps. After the planarization process, the top surface 203TS of the top glue layer 203 and the top surface 503TS of the top energy-removable layer 503 may be substantially coplanar.

Figure 15:
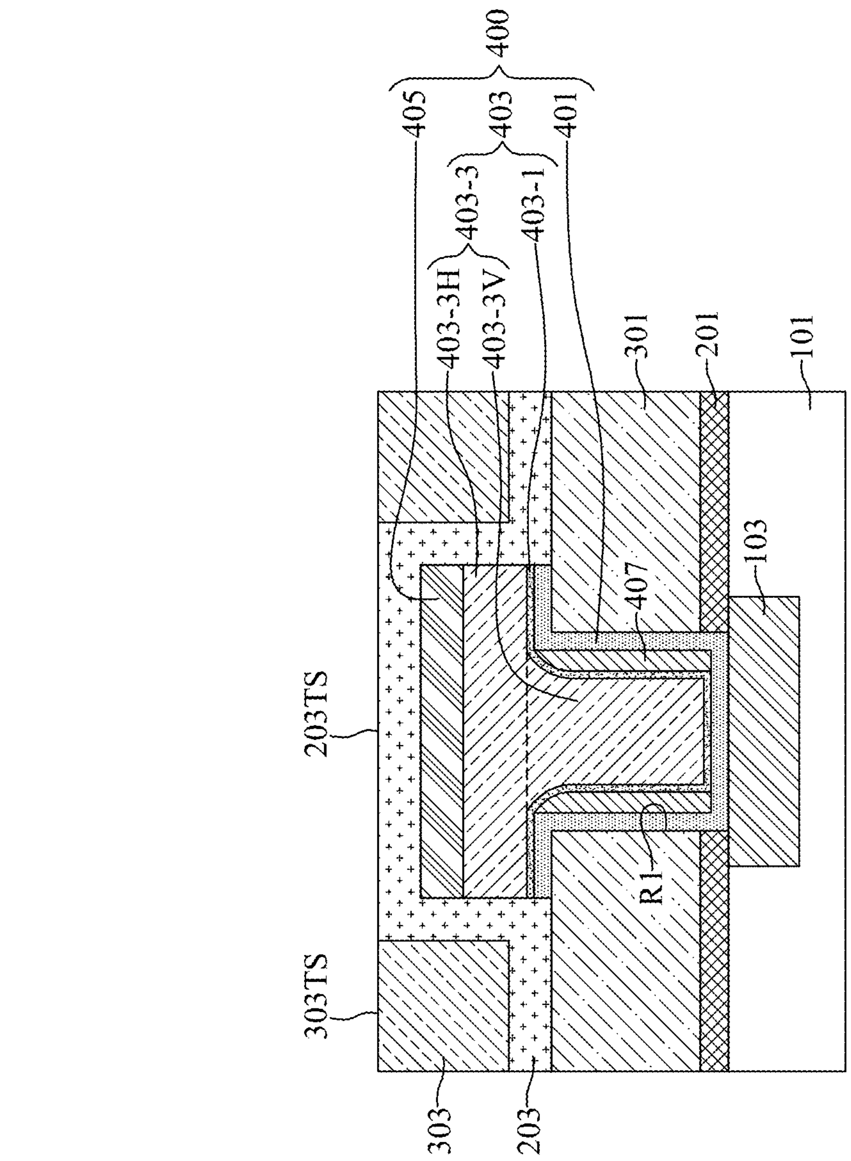
Figure 16:
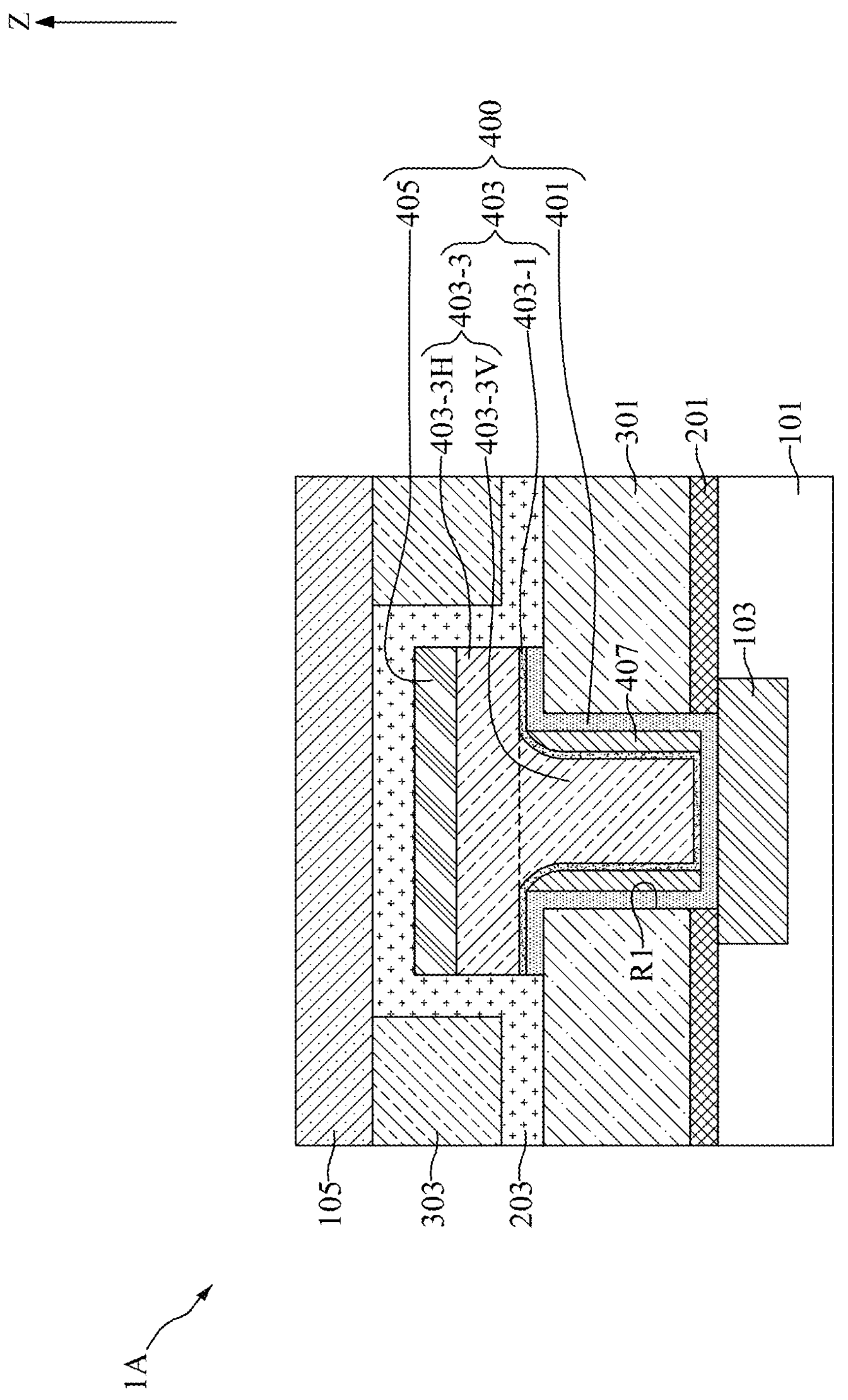

With reference to FIGS. 1, 15, and 16, at step S17, an energy treatment may be performed to turn the bottom energy-removable layer 501 into a bottom dielectric layer 301, turn the top energy-removable layer 503 into a top dielectric layer 303, and a capping dielectric layer 105 may be formed on the top dielectric layer 303 and the top glue layer 203.

With reference to FIG. 15, the energy treatment may be performed to the intermediate semiconductor device in FIG. 14 by applying the energy source thereto. The energy source may include heat, light, or a combination thereof. When heat is used as the energy source, the temperature of the energy treatment may be between about 800° C. and about 900° C. When light is used as an energy source, ultraviolet light may be applied. The energy treatment may remove the decomposable porogen material from the bottom energy-removable layer 501 and the top energy-removable layer 503 to generate empty spaces (pores), with the base material remaining in place. The empty spaces may be filled with air so that a dielectric constant of the resulting layers containing the empty spaces may be significantly low.

After the energy treatment, the bottom energy-removable layer 501 may be turned into the bottom dielectric layer 301. The top energy-removable layer 503 may be turned into the top dielectric layer 303. The top surface 303TS of the top dielectric layer 303 and the top surface 203TS of the top glue layer 203 may be substantially coplanar. In some embodiments, the bottom dielectric layer 301 and the top dielectric layer 303 may be both porous. In some embodiments, the porosity of the top dielectric layer 303 may be greater than the porosity of the bottom dielectric layer 301. In some embodiments, the porosity of the bottom dielectric layer 301 may be greater than the porosity of the bottom glue layer 201 or the top glue layer 203. In some embodiments, the porosity of the bottom dielectric layer 301 may be between about 20% and about 50%. In some embodiments, the porosity of the top dielectric layer 303 may be greater than 50%.

With reference to FIG. 16, the capping dielectric layer 105 may be formed on the top dielectric layer 303 and on the top glue layer 203. In some embodiments, the capping dielectric layer 105 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. The term “low-k” as used throughout the present application denotes a dielectric material that has a dielectric constant of less than silicon dioxide. In some embodiments, the capping dielectric layer 105 may include a self-planarizing material such as a spin-on glass or a spin-on low-k dielectric material such as SiLK™. The use of a self-planarizing dielectric material may avoid the need to perform a subsequent planarizing step. In some embodiments, the capping dielectric layer 105 may be formed by a deposition process including, for example, chemical vapor deposition, plasma enhanced chemical vapor deposition, evaporation, or spin-on coating.

By employing the bottom dielectric layer 301 and the top dielectric layer 303 having low dielectric constant, the parasitic capacitance of the semiconductor device 1A may be reduced. As a result, the performance of the semiconductor device 1A may be improved. In addition, the barrier layer 401 may prevent outgassing issues of the porous layers (i.e., the bottom dielectric layer 301 and the top dielectric layer 303) to avoid the damage of the interconnector structure 400 and to improve the reliability of the semiconductor device 1A. Furthermore, the bottom glue layer 201 and the top glue layer 203 may also improve the adhesion of the bottom dielectric layer 301 and the top dielectric layer 303.

Figure 17:
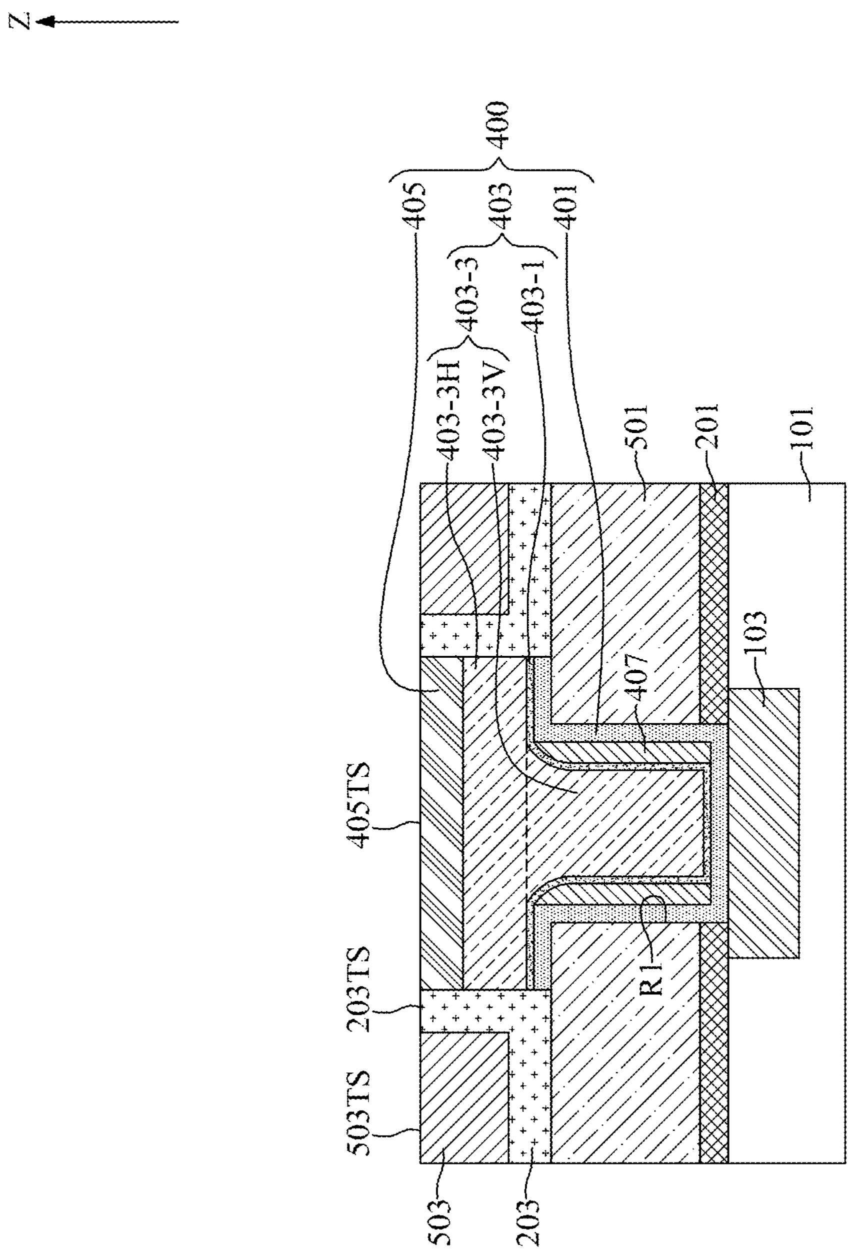
FIGS. 17 to 19 illustrate, in schematic cross-sectional view diagrams, a flow for fabricating a semiconductor device in accordance with another embodiment of the present disclosure.
Figure 18:
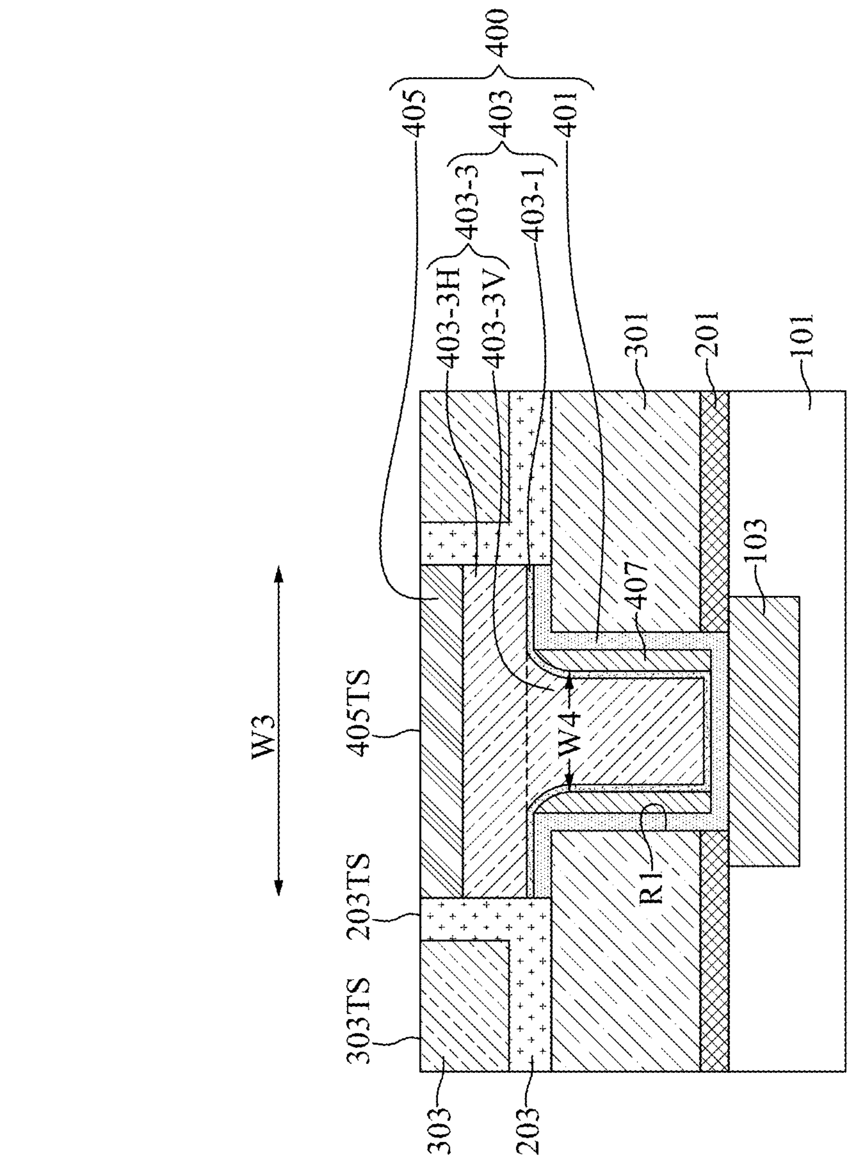
Figure 19:
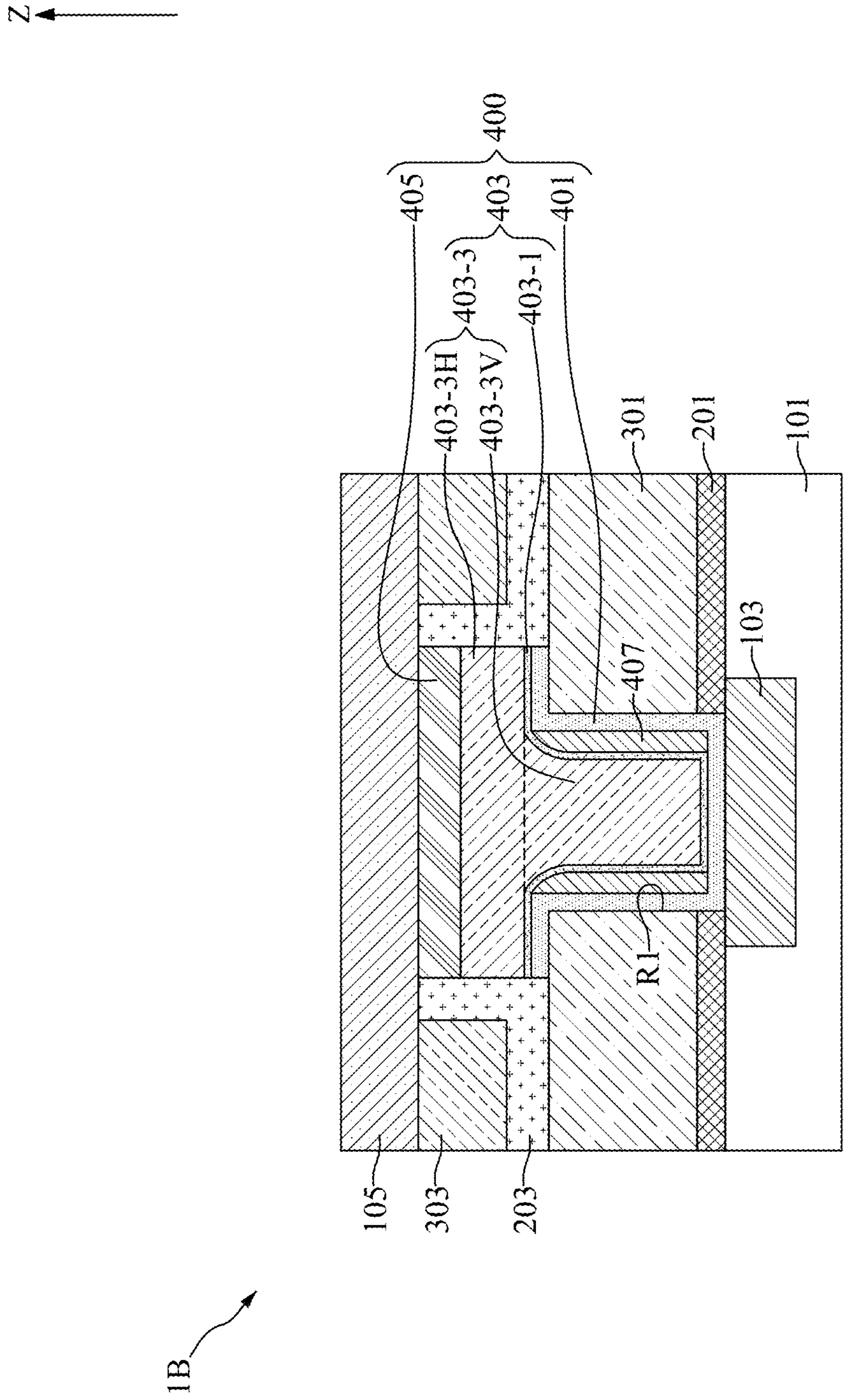

FIGS. 17 to 19 illustrate, in schematic cross-sectional view diagrams, a flow for fabricating a semiconductor device 1B in accordance with another embodiment of the present disclosure.

With reference to FIG. 17, an intermediate semiconductor device may be fabricated with a procedure similar to that illustrated in FIGS. 2 to 13, and descriptions thereof are not repeated herein. A planarization process, such as chemical mechanical polishing, may be performed until the top surface 405TS of the hard mask layer 405 is exposed to remove excess material and provide a substantially flat surface for subsequent processing steps. The top surface 405TS of the hard mask layer 405, the top surface 203TS of the top glue layer 203, and the top surface 503TS of the top energy-removable layer 503 may be substantially coplanar.

With reference to FIG. 18, the energy treatment may be performed with a procedure similar to that illustrated in FIG. 15, and descriptions thereof are not repeated herein. The top surface 405TS of the hard mask layer 405, the top surface 203TS of the top glue layer 203, and the top surface 303TS of the top dielectric layer 303 may be substantially coplanar.

With reference to FIG. 19, the capping dielectric layer 105 may be formed on the hard mask layer 405, on the top glue layer 203, and on the top dielectric layer 303 with a procedure similar to that illustrated in FIG. 16, and descriptions thereof are not repeated herein.

Figure 20:
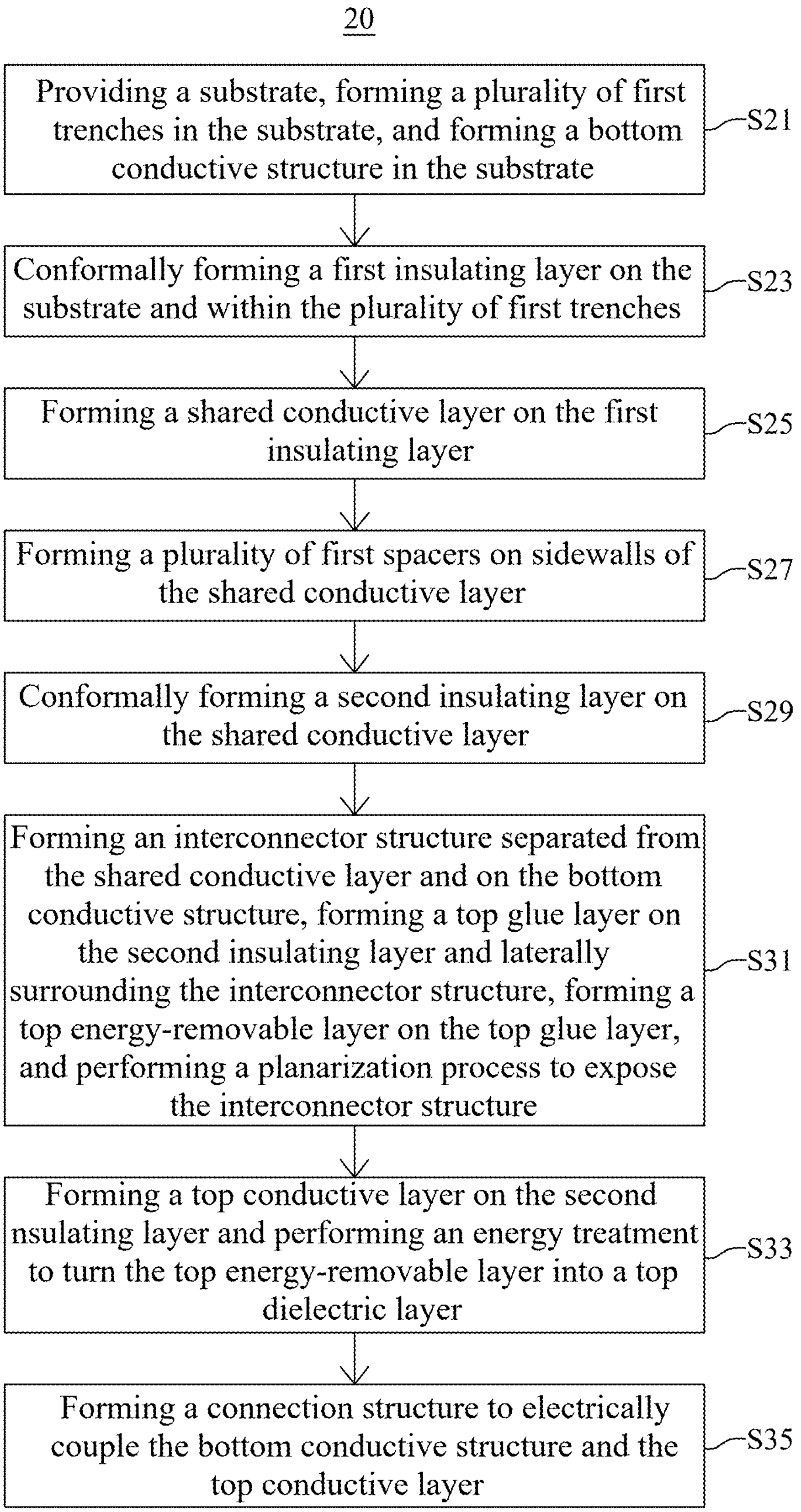
FIG. 20 illustrates, in a flowchart diagram form, a method for fabricating a semiconductor device in accordance with one embodiment of the present disclosure.

FIG. 20 illustrates, in a flowchart diagram form, a method 20 for fabricating a semiconductor device 1C in accordance with one embodiment of the present disclosure. FIGS. 21 to 41 illustrate, in schematic cross-sectional view diagrams, a flow for fabricating the semiconductor device 1C in accordance with one embodiment of the present disclosure.

With reference to FIGS. 20 to 24, at step S21, a substrate 101 may be provided, a plurality of first trenches 701 may be formed in the substrate 101, and a bottom conductive structure 110 may be formed in the substrate 101.

Figure 21:
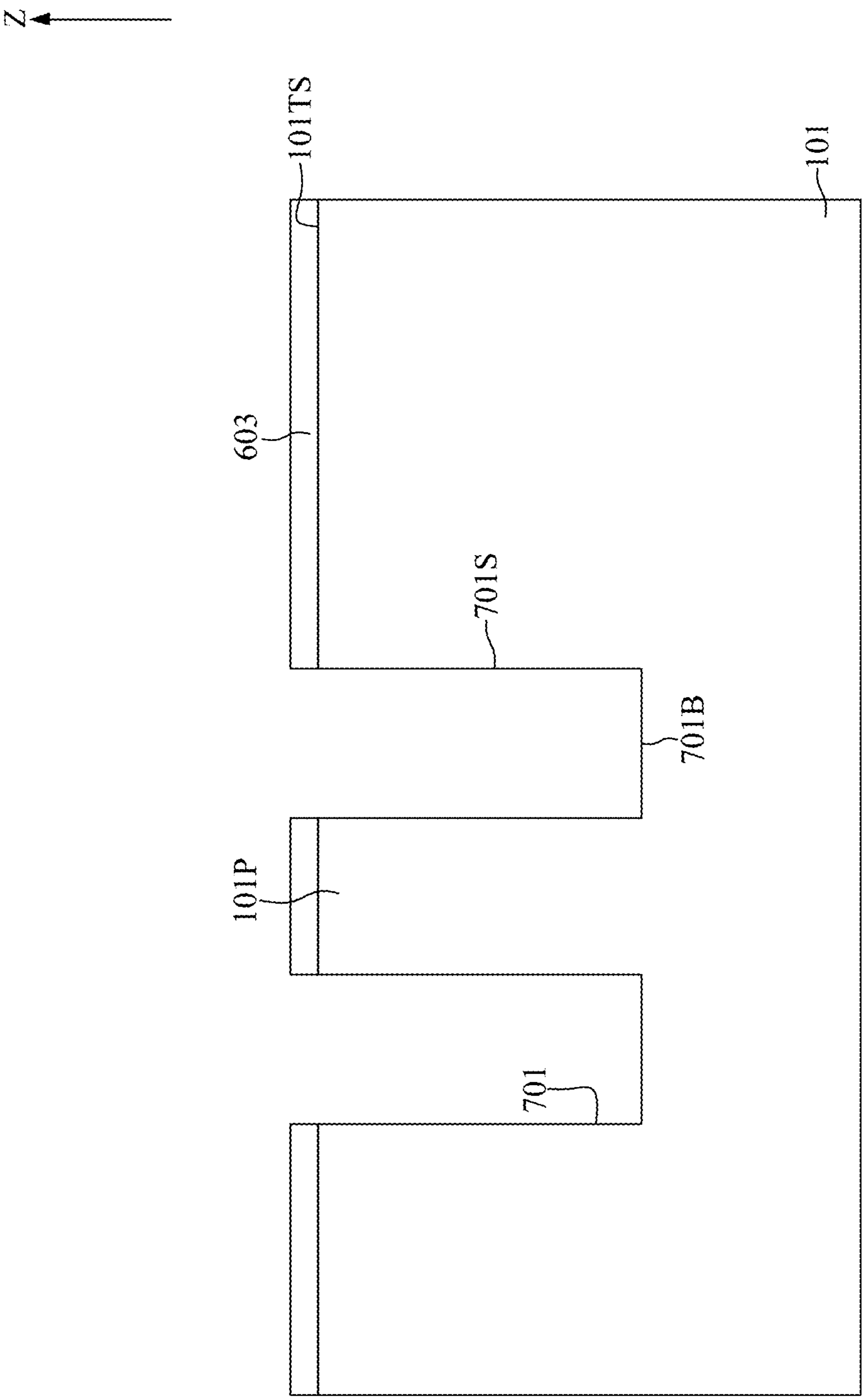
FIGS. 21 to 41 illustrate, in schematic cross-sectional view diagrams, a flow for fabricating the semiconductor device in accordance with one embodiment of the present disclosure.

With reference to FIG. 21, the substrate 101 may be provided as illustrated in FIG. 2, and descriptions thereof are not repeated herein. A second hard mask layer 603 may be formed on the substrate 101. The second hard mask layer 603 may be formed of, for example, silicon oxide, silicon nitride, silicon oxynitride, silicon nitride oxide, boron nitride, silicon boron nitride, phosphorus boron nitride, or boron carbon silicon nitride. The second hard mask layer 603 may include a pattern of the first trenches 701.

With reference to FIG. 21, an etch process, such as an anisotropic dry etch process, may be performed using the second hard mask layer 603 as the mask to remove portions of the substrate 101 and concurrently form the first trenches 701. The first trenches 701 may extend downward from the top surface 101TS of the substrate 101. A pillar portion 101P of the substrate 101 may be formed between an adjacent pair of the first trenches 701. Each of the first trenches 701 may include two sidewalls 701S and a bottom surface 701B. In some embodiments, an aspect ratio of the first trenches 701 may be between about 1:6 and about 1:20. In some embodiments, the bottom surfaces 701B of the first trenches 701 may be rounded. It should be noted that only two first trenches 701 are shown in FIG. 21 for clarity and illustration purpose. The number of first trenches 701 can be more than two.

Figure 22:
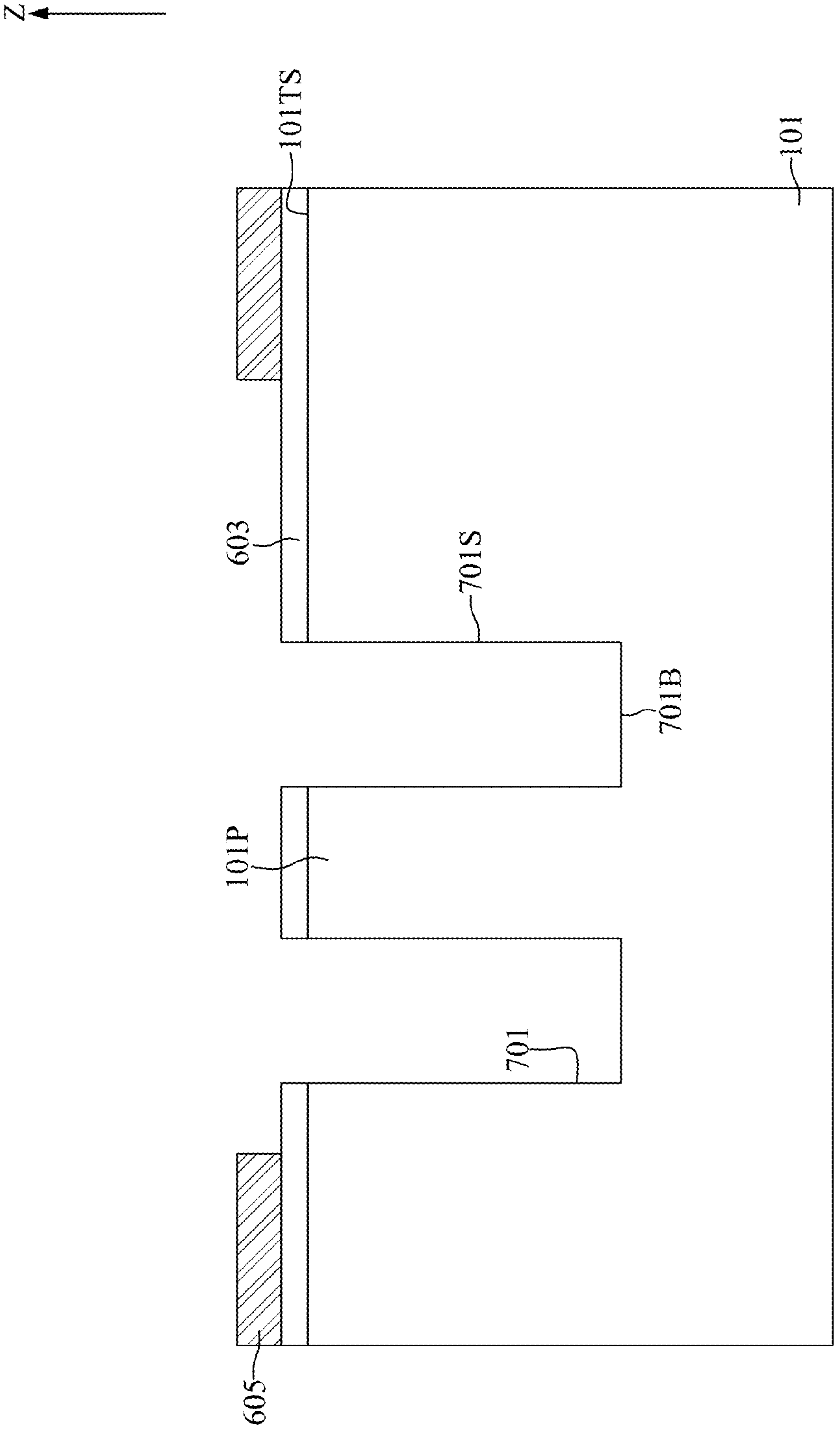

With reference to FIG. 22, a second mask layer 605 may be formed on the second hard mask layer 603. The second mask layer 605 may be a photoresist layer and may have a pattern of the bottom conductive structure 110. Some portions of the second hard mask layer 603 may be exposed through the pattern of the second mask layer 605. For example, the portion of the second hard mask layer 603 on the pillar portion 101P of the substrate 101 may not be covered by the second mask layer 605.

Figure 23:
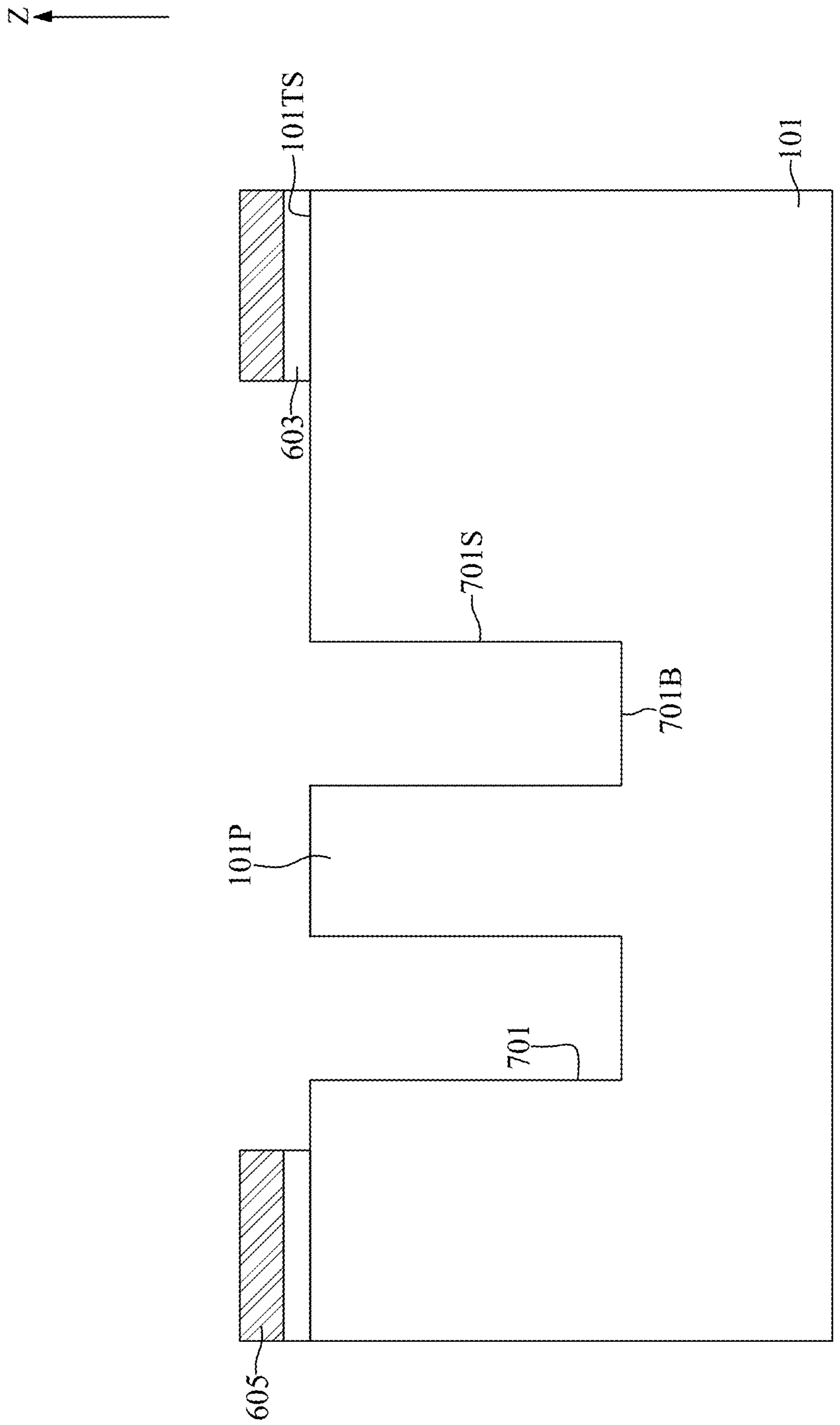

With reference to FIG. 23, subsequently, an etching process may be performed to remove the exposed portions of the second hard mask layer 603. After the etch process, the second mask layer 605 may be removed. In some embodiments, the etching process may be a wet etching process or an anisotropic dry etching process.

Figure 24:
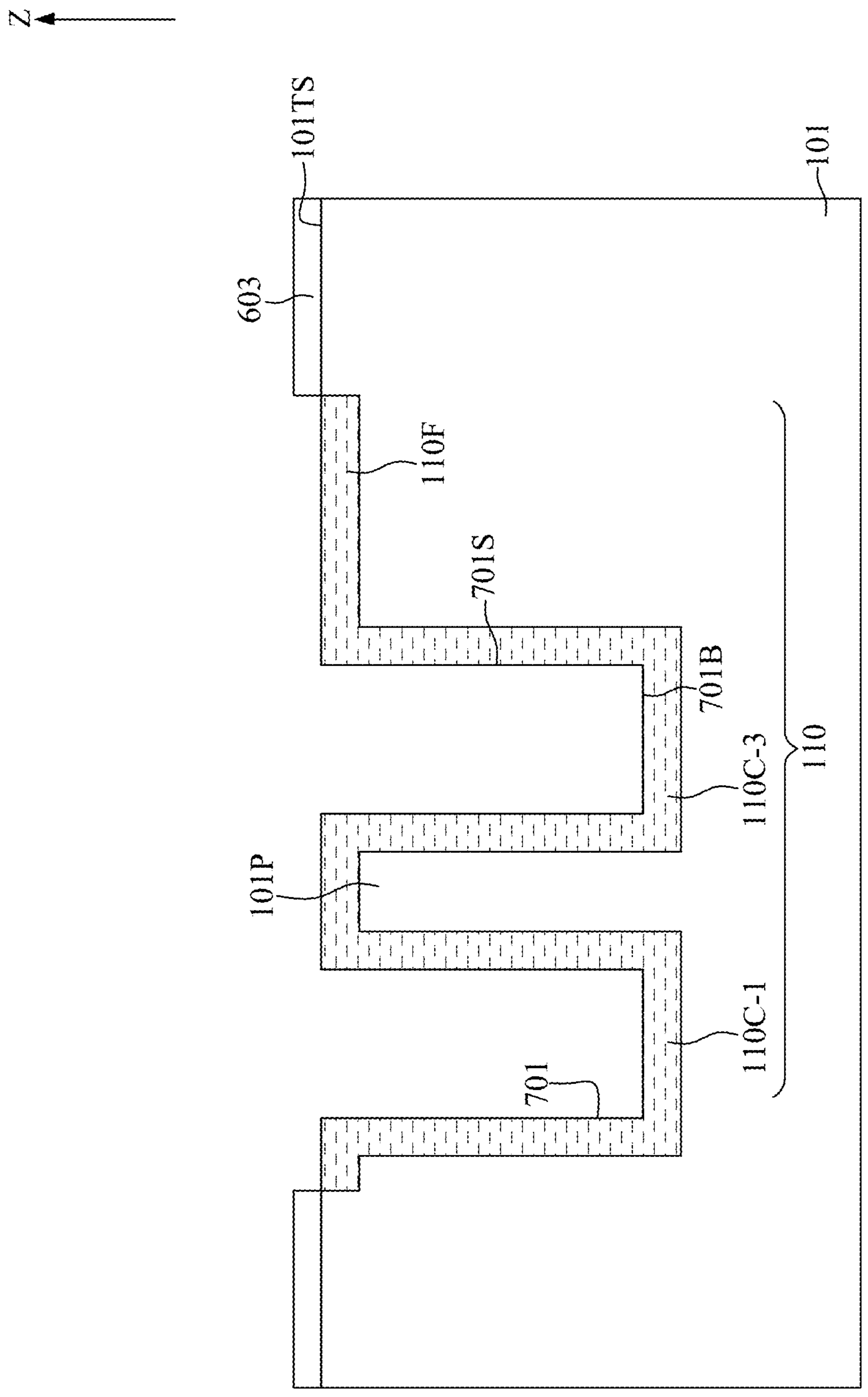

With reference to FIG. 24, an implantation process may be performed to dope regions of the substrate 101 and turn those regions of the substrate 101 into the bottom conductive structure 200. Detailedly, the regions adjacent to the exposed top surface 101TS of substrate 101 and the regions adjacent to the sidewalls 701S and the bottom surfaces 701B of the first trenches 701 may be turned into the bottom conductive structure 110. That is, the bottom conductive structure 110 may have a geometry that follows the contours of the first trenches 701. The dopant of the implantation process may be, for example, phosphorus, arsenic, antimony, or boron.

With reference to FIG. 24, the bottom conductive structure 110 may include flat portions 110F and concave portions 110C-1, 110C-3. The flat portions 110F of the bottom conductive structure 110 may be formed adjacent to the exposed top surface 101TS of substrate 101. The concave portions 110C-1, 110C-3 of the bottom conductive structure 110 may be formed adjacent to the sidewalls 701S and the bottom surfaces 701B of the first trenches 701. It should be noted that the pillar portion 101P located between the concave portions 110C-1, 110C-3 of the bottom conductive structure 110 may still undoped. The geometry of the pillar portion 101P may provide an increased amount of area for a first capacitor unit CAP1 which will be illustrated later. As a result, the presence of the pillar portion 101P may provide an increased capacitance for the semiconductor device 1C. After the formation of the bottom conductive structure 110, the second hard mask layer 603 may be removed.

Figure 25:
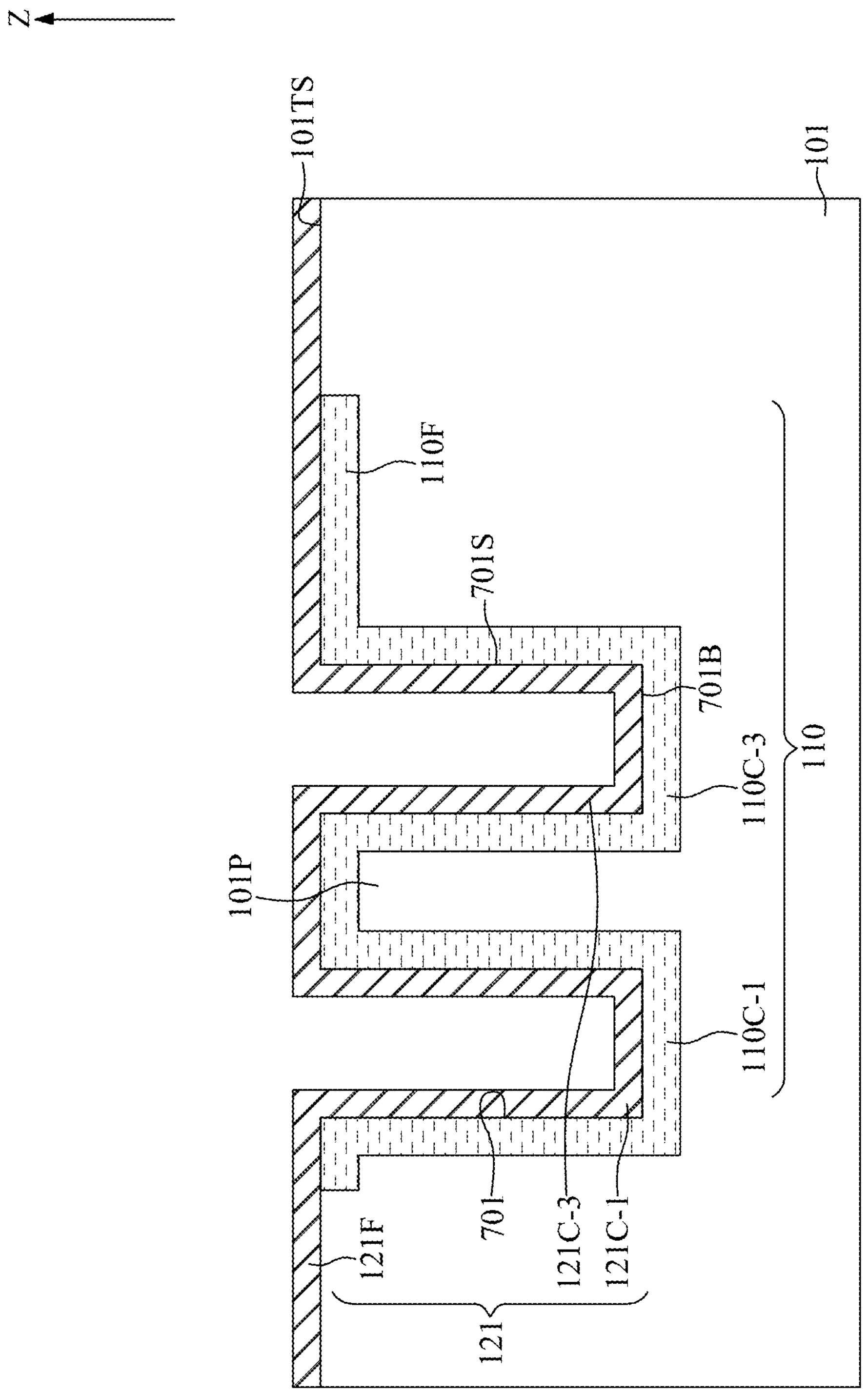

With reference to FIGS. 20 and 25, at step S23, a first insulating layer 121 may be conformally formed on the substrate 101 and within the plurality of first trenches 701.

With reference to FIG. 25, the first insulating layer 121 may be conformally formed on the top surface 101TS of the substrate 101, on the sidewalls 701S of the first trenches 701, and on the bottom surfaces 701B of the first trenches 701. The first insulating layer 121 may electrically isolate the bottom conductive structure 110 from conductive features, which will be fabricated later, above the first insulating layer 121. The first insulating layer 121 may include flat portion 121F and concave portions 121C-1, 121C-3. The flat portion 121F may be formed on the top surface 101TS of the substrate 101. The concave portions 121C-1, 121C-3 may be formed on the sidewalls 701S and bottom surfaces 701B of the first trenches 701. In some embodiments, the first insulating layer 121 may have a thickness between about 10 angstroms and about 1000 angstroms. In some embodiments, the first insulating layer 121 may be formed by low pressure chemical vapor deposition, plasma-enhanced chemical vapor deposition, atomic layer deposition, or other applicable deposition processes.

In some embodiments, the first insulating layer 121 may be a stacked layer structure such as an oxide-nitride-oxide structure. In some embodiments, the first insulating layer 121 may be formed of, for example, silicon oxide, silicon nitride, silicon oxynitride, silicon nitride oxide, or the like.

In some embodiments, the first insulating layer 121 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. In some embodiments, the first insulating layer 121 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the first insulating layer 121 may be a stacked layer structure that includes, for example, one layer of silicon oxide and another layer of high-k dielectric material.

Figure 26:
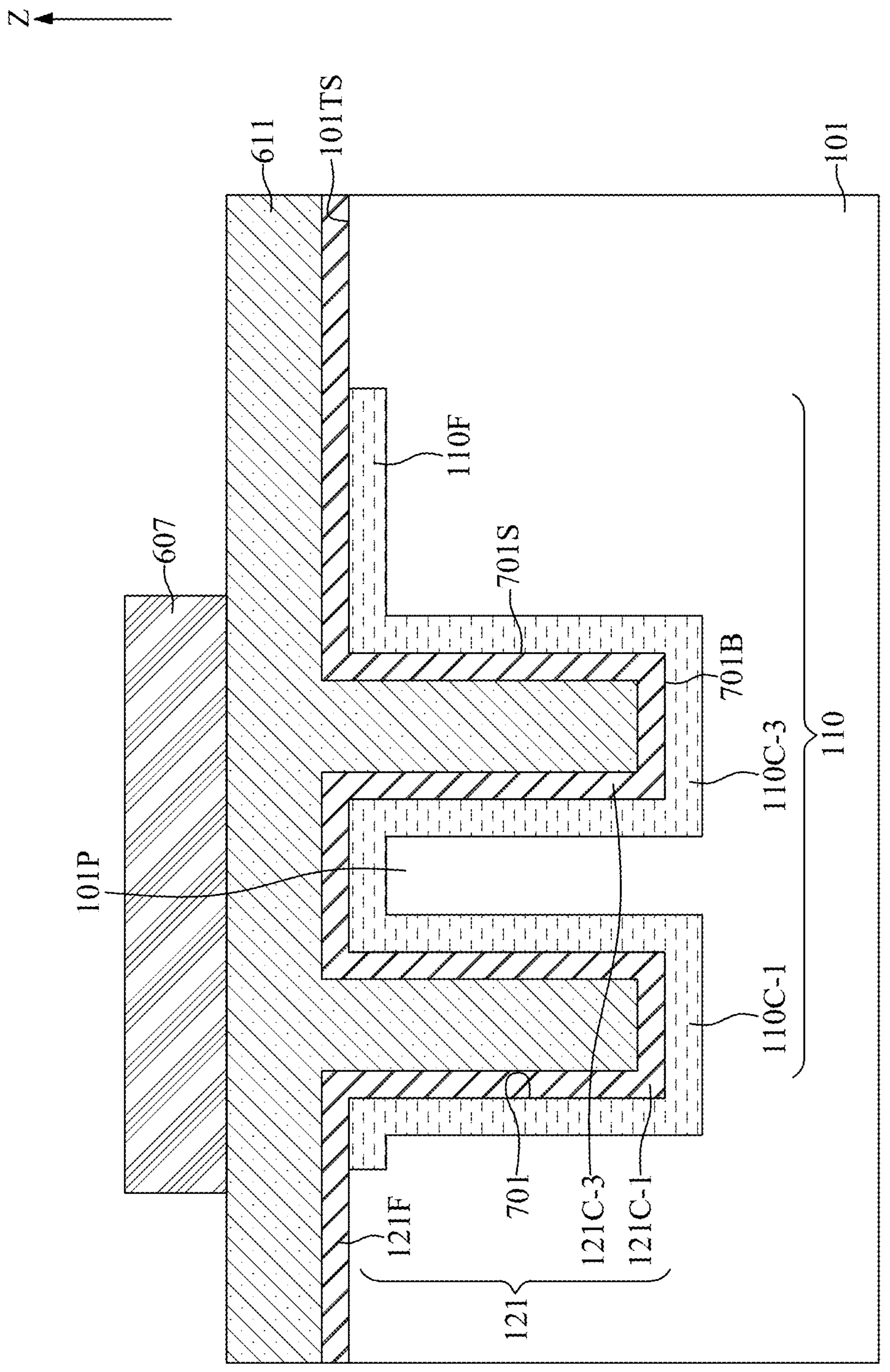
Figure 27:
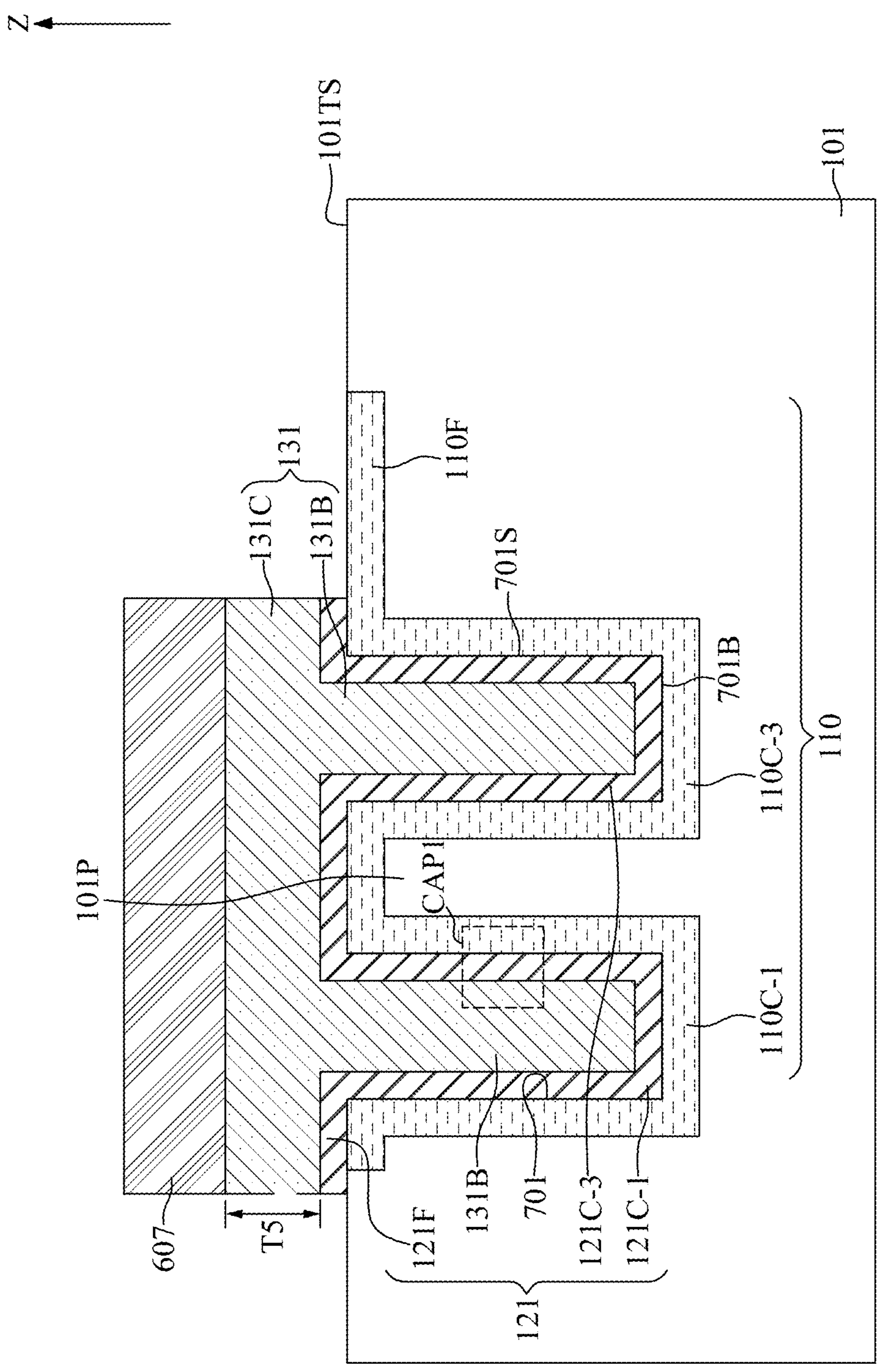

With reference to FIGS. 20, 26 and 27, at step S25, a shared conductive layer 131 may be formed on the first insulating layer 121.

With reference to FIG. 26, a layer of first conductive material 611 may be formed to fill the first trenches 701 and cover the first insulating layer 121. A planarization process, such as chemical mechanical polishing, may be performed to provide a substantially flat surface for subsequent processing steps.

In some embodiments, the first conductive material 611 may be, for example, polycrystalline silicon, doped polycrystalline silicon, polycrystalline silicon germanium, doped polycrystalline silicon germanium, aluminum, copper, platinum, gold, titanium, titanium nitride, tantalum, tantalum nitride, tungsten, tungsten nitride, or alloy of gold and copper.

In some embodiments, the first conductive material 611 may be, for example, a material from the class containing metal borides, metal phosphides, and metal antimonides of the transition metals from the secondary groups IV, V and VI of the periodic table. The transition metals may be titanium, zirconium, hafnium, vanadium, niobium, tantalum, chromium, molybdenum, or tungsten. For example, the first conductive material 611 may be titanium diboride, zirconium diboride, hafnium diboride, titanium phosphide, zirconium phosphide, hafnium phosphide, titanium antimonide, zirconium antimonide, or hafnium antimonide. The aforementioned material may have a high thermal stability and excellent conductivity which specific resistance may be less than 20 microohm-cm.

With reference to FIG. 26, a third mask layer 607 may be formed on the layer of first conductive material 611. The third mask layer 607 may be a photoresist layer and may have a pattern of the shared conductive layer 131.

With reference to FIG. 27, an etching process, such as an anisotropic dry etch process, may be performed to remove portions of the first conductive material 611 and portions of the first insulating layer 121. After the etch process, the remaining first conductive material 611 may be turned into the shared conductive layer 131 and the first insulating layer 121 may be trimmed. A portion of the flat portions 110F of the bottom conductive structure 110 may be exposed. After the etch process, the third mask layer 607 may be removed.

With reference to FIG. 27, the shared conductive layer 131 may include a connection portion 131C and bottom portions 131B. The connection portion 131C of the shared conductive layer 131 may be horizontally above the top surface 101TS of the substrate 101 and on the flat portions 121F of the first insulating layer 121. The connection portion 131C of the shared conductive layer 131 may have a thickness T5 between about 50 angstroms and about 1000 angstroms. The bottom portions 131B of the shared conductive layer 131 may downwardly extend from the connection portion 131C of the shared conductive layer 131 and toward the substrate 101. The concave portions 121C-1, 121C-3 of the first insulating layer 121 may laterally surround the bottom portions 131B of the shared conductive layer 131.

It should be noted that "an element A surrounds an element B" (or similar language) as used herein means that the element A is at least partially around the element B but does not necessarily mean that the element A completely encloses the element B.

With reference to FIG. 27, the bottom conductive structure 110, the first insulating layer 121, and the shared conductive layer 131 together configure the first capacitor unit CAP1.

Figure 28:
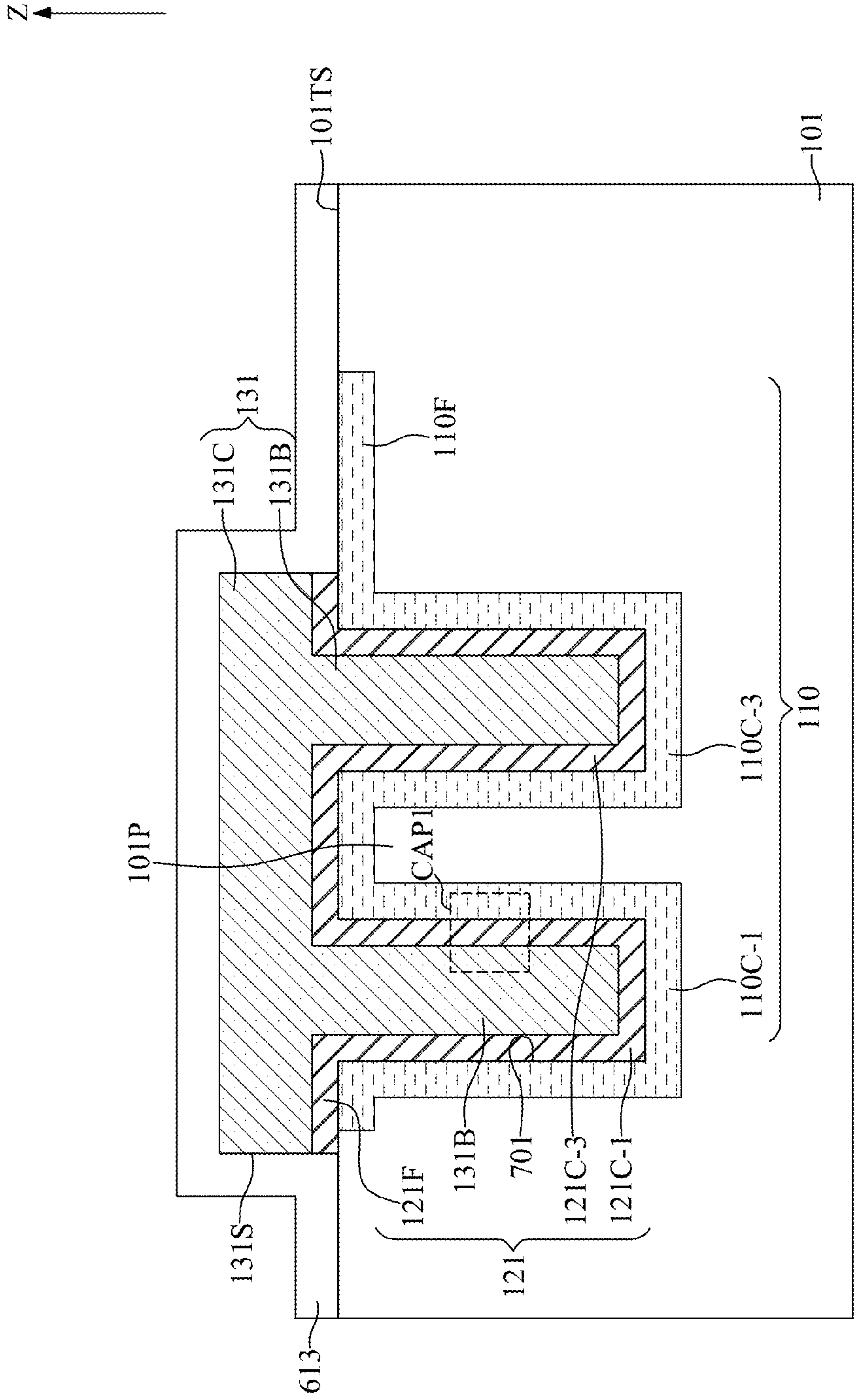
Figure 29:
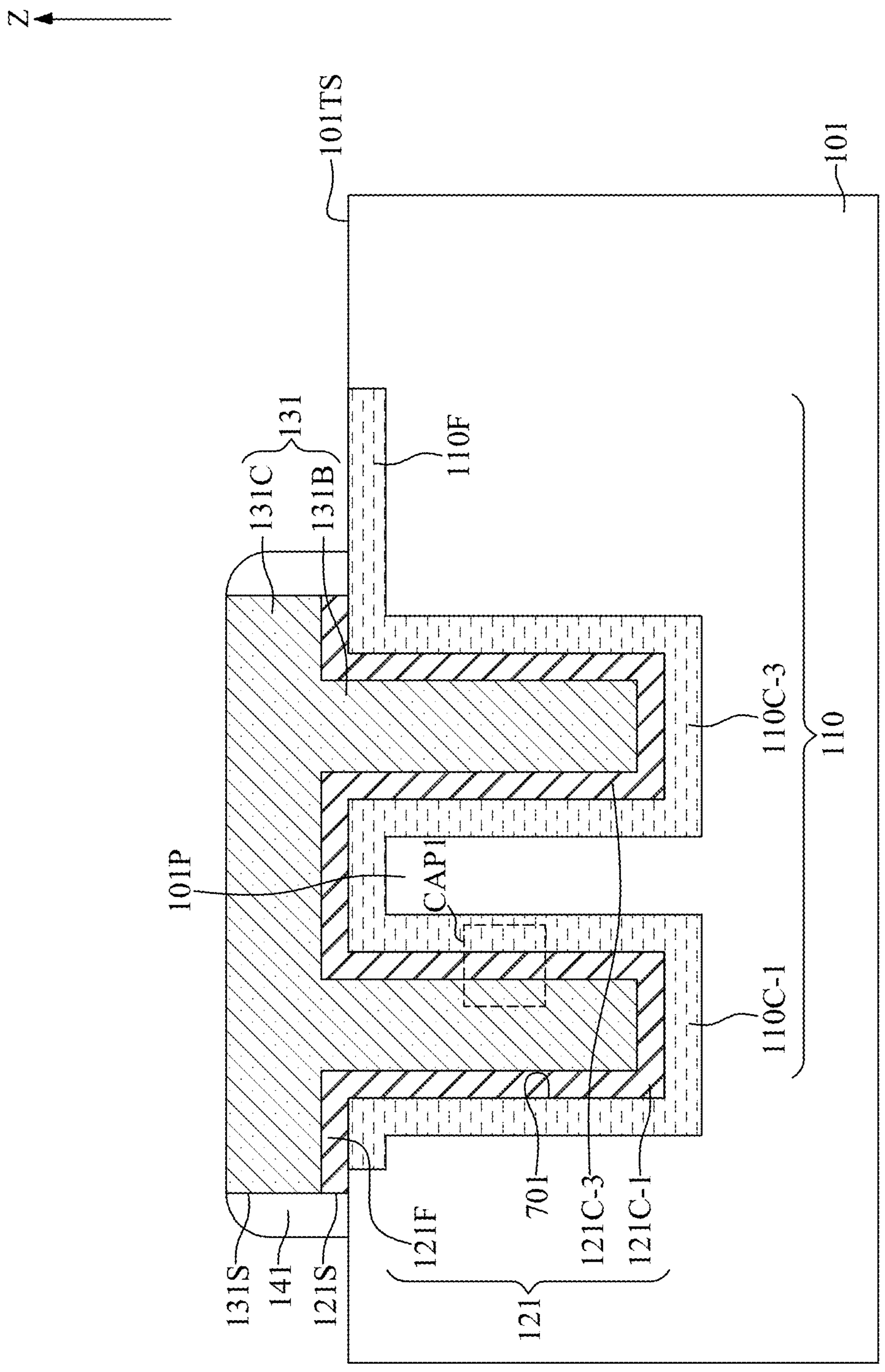

With reference to FIGS. 20, 28, and 29, at step S27, a plurality of first spacers 141 may be formed on sidewalls 131S of the shared conductive layer 131.

With reference to FIG. 28, a layer of first insulating material 613 may be formed to cover the top surface 101TS of the substrate 101, the sidewalls 121S of the first insulating layer 121, the sidewalls 131S and the top surface of the shared conductive layer 131. In some embodiments, the first insulating material 613 may be for example, a semiconductor oxide, a semiconductor nitride, a semiconductor carbide, a semiconductor oxynitride, or a combination thereof.

With reference to FIG. 29, an etching process, such as an anisotropic dry etching process, may be performed to remove portions of the layer of first insulating material 613. The remaining first insulating material 613 may be referred to as the first spacers 141. In some embodiments, the first spacers 141 may be disposed on sidewalls 131S of the shared conductive layer 131 and sidewalls 121S of the first insulating layer 121. In some embodiments, the first spacers 401 may have a thickness between about 1 nm and about 3 nm. The first spacers 401 may provide additional electrical isolation to the shared conductive layer 303 in the horizontal direction.

Figure 30:
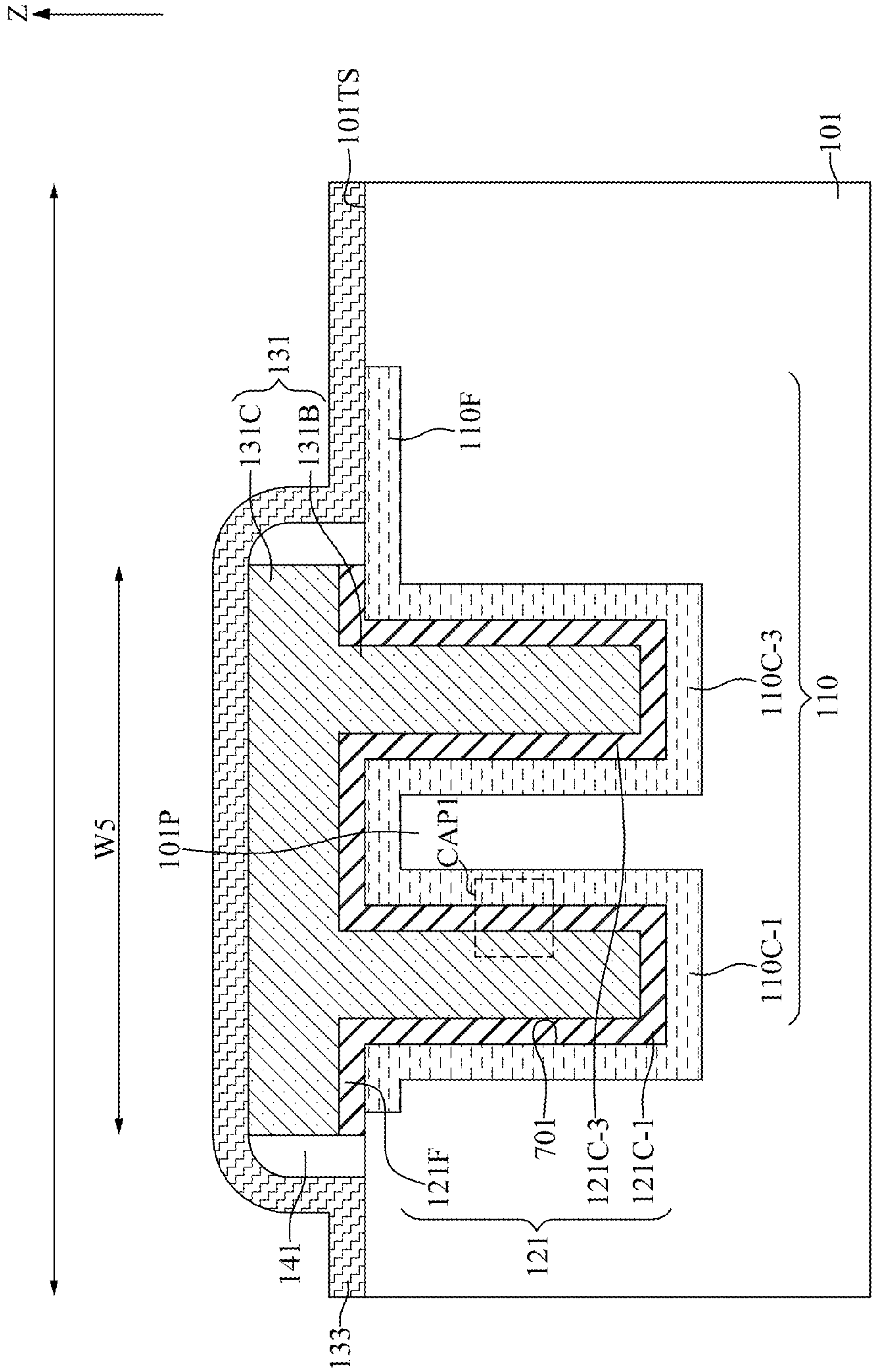

With reference to FIGS. 20 and 30, at step S29, a second insulating layer 133 may be conformally formed on the shared conductive layer 131.

With reference to FIG. 30, the second insulating layer 133 may be formed to cover the top surface 101TS of the substrate 101, the first spacers 141, and the shared conductive layer 131. A width W6 of the second insulating layer 133 may be greater than a width W5 of the shared conductive layer 131. The second insulating layer 133 may be formed of the same material as the first insulating layer 121 but is not limited thereto. The second insulating layer 133 may electrically isolate the shared conductive layer 131 from conductive features, which will be fabricated later, above the second insulating layer 133.

With reference to FIG. 20 and FIGS. 31 to 36, at step S31, an interconnector structure 400 may be formed separated from the shared conductive layer 131 and on the bottom conductive structure 110, a top glue layer 203 may be formed on the second insulating layer 133 and laterally surrounding the interconnector structure 400, a top energy-removable layer 503 may be formed on the top glue layer 203, and a planarization process may be performed to expose the interconnector structure 400.

Figure 31:
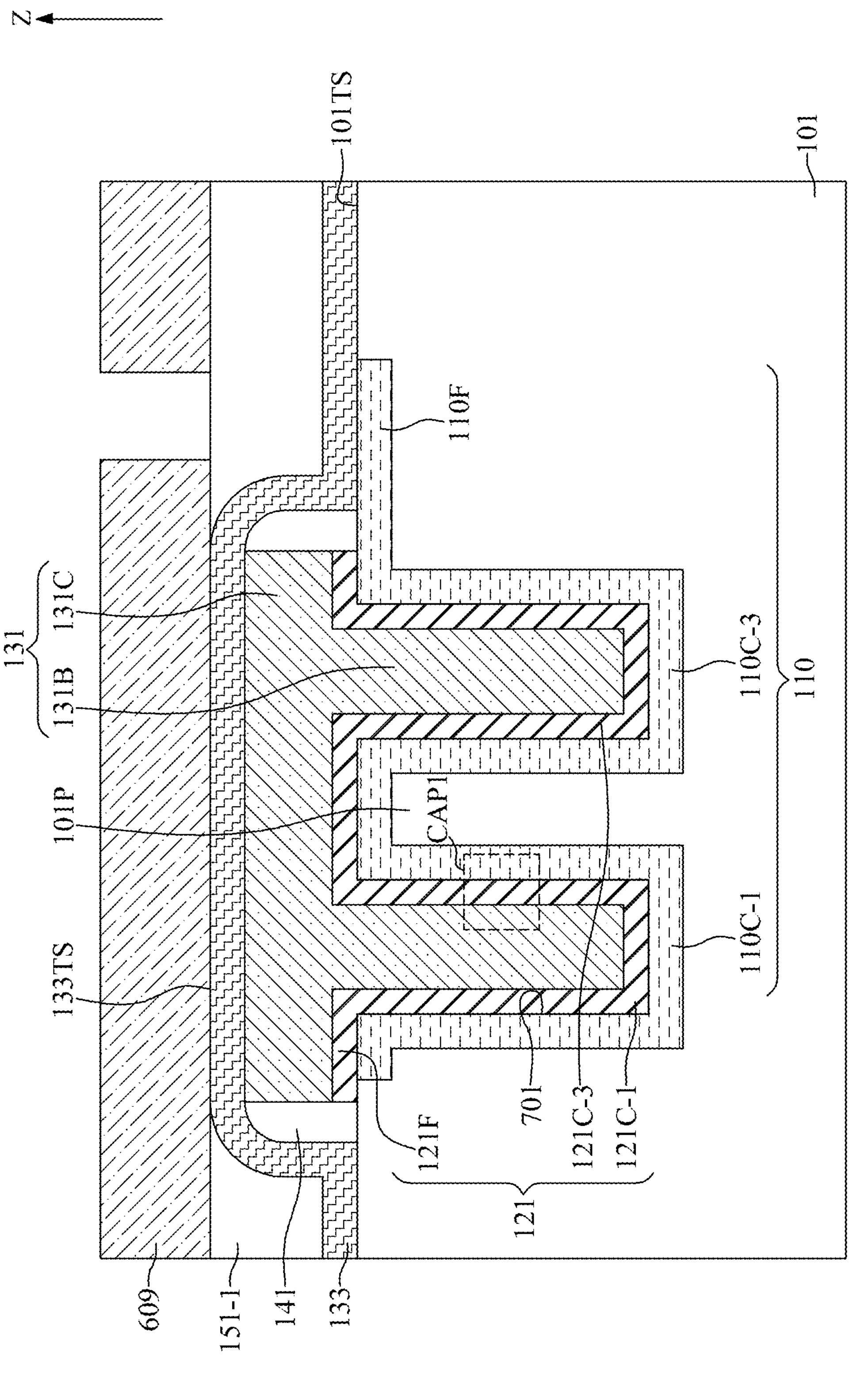

With reference to FIG. 31, an inter-layer dielectric 151-1 may be formed on the second insulating layer 133. A planarization process, such as chemical mechanical polishing, may be performed until the top surface 133TS of the second insulating layer 133 is exposed to remove excess material and provide a substantially flat surface for subsequent processing steps. In some embodiments, the inter-layer dielectric 151-1 may be formed with a procedure similar to the bottom energy-removable layer 501 that illustrated in FIG. 4, and descriptions thereof are not repeated herein. That is, the inter-layer dielectric 151-1 may be porous. In some embodiments, the inter-layer dielectric 151-1 may be formed of, for example, a low-k dielectric material such as phosphosilicate glass, borophosphosilicate glass, fluorinated silicate glass, spin-on-glass, spin-on-polymers, silicon carbon material, or a combination thereof.

With reference to FIG. 31, a fourth mask layer 609 may be formed on the inter-layer dielectric 151-1 and the second insulating layer 133. In some embodiments, the fourth mask layer 609 may be a photoresist layer and may include the pattern of second recess R2 which will be illustrated later.

Figure 32:
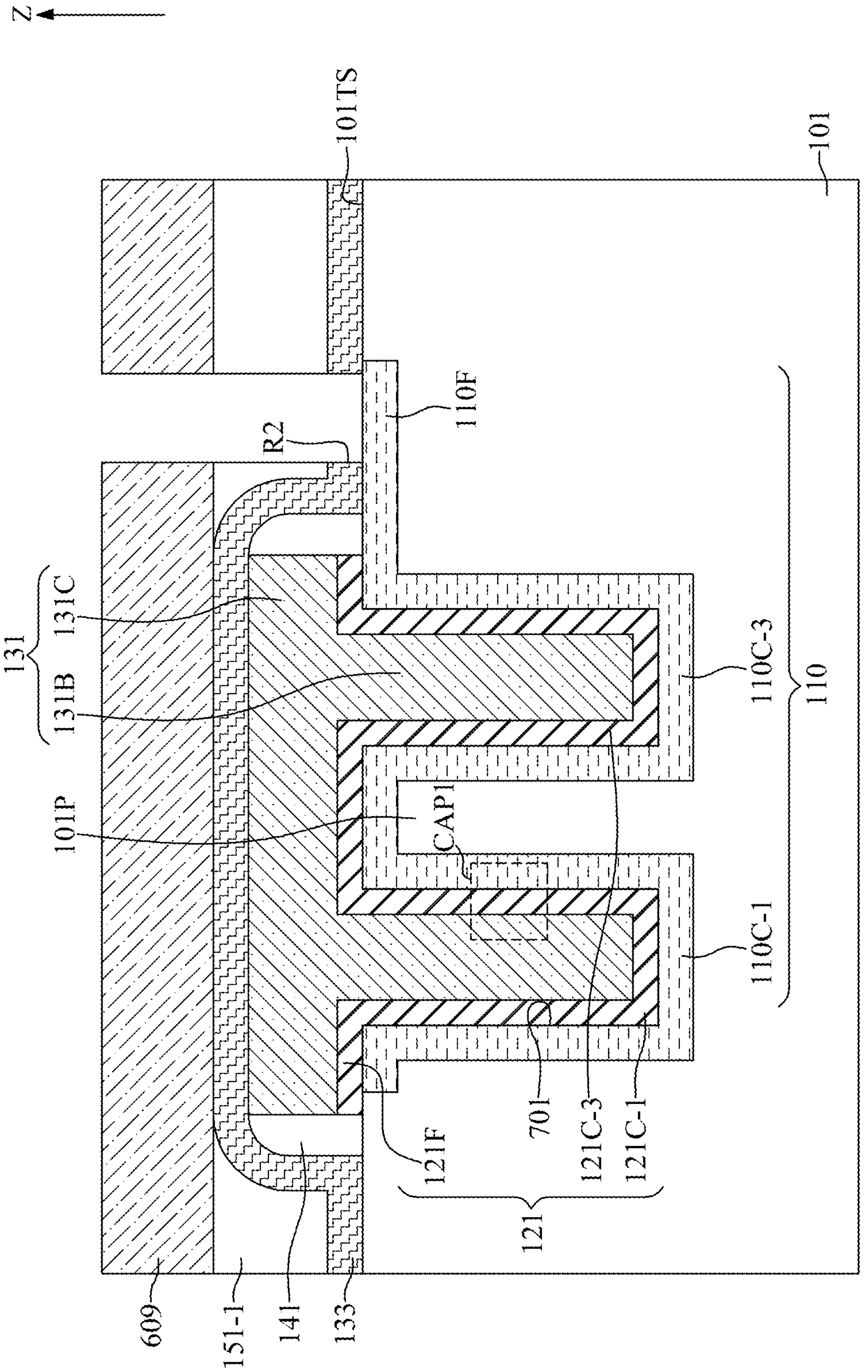

With reference to FIG. 32, an etching process may be performed using the fourth mask layer 609 as the mask to remove portions of the inter-layer dielectric 151-1 and the second insulating layer 133. The second recess R2 may be formed penetrating the inter-layer dielectric 151-1 and the second insulating layer 133. Part of the flat portions 110F of the bottom conductive structure 110 is exposed through the second recess R2. The second recess R2 may be separated from the connection portion 131C of the shared conductive layer 131 with the first spacer 141 and second insulating layer 133 disposed in between. After the formation of the second recess R2, the fourth mask layer 609 may be removed.

Figure 33:
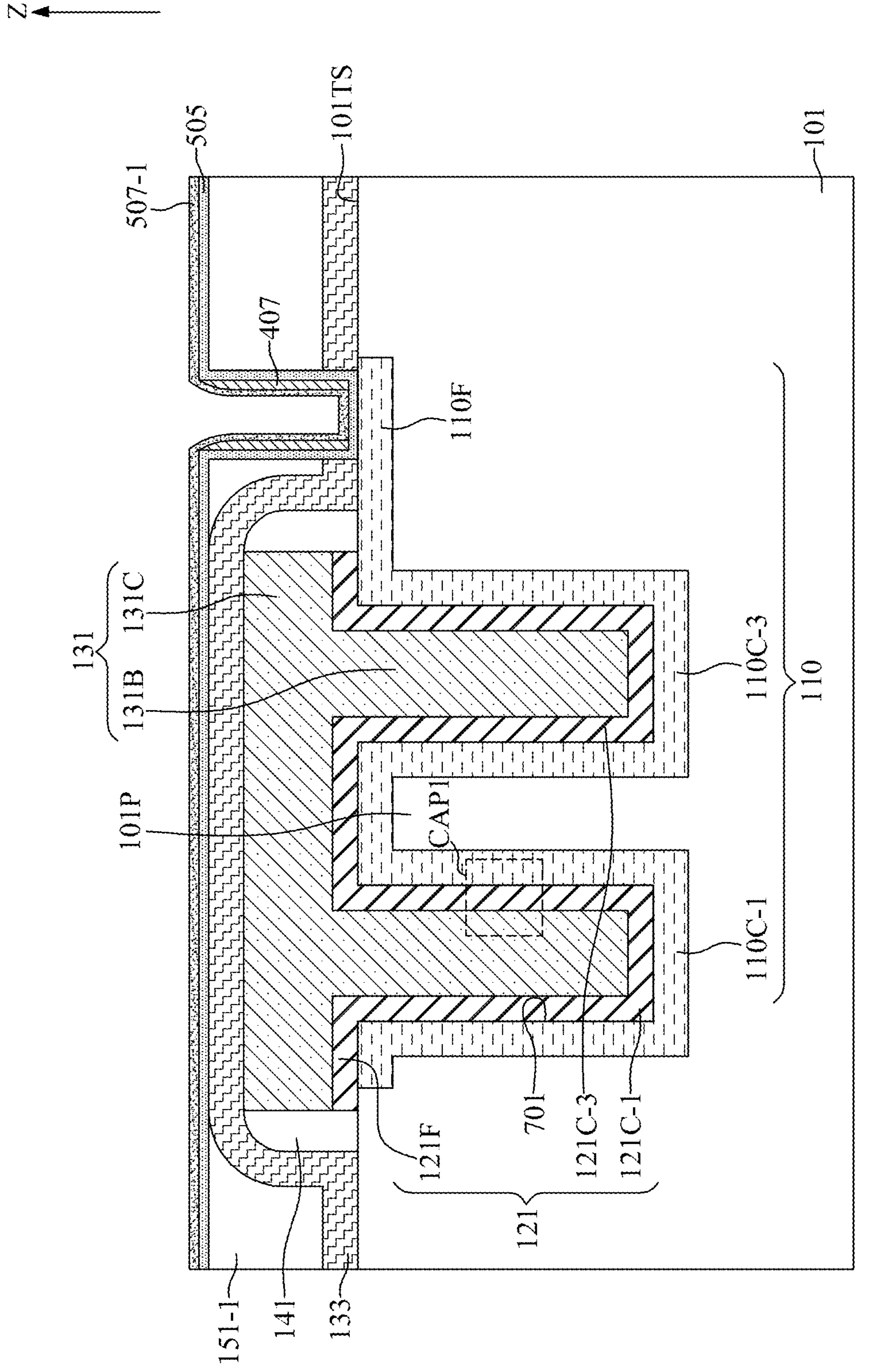

With reference to FIG. 33, the layer of barrier material 505, the nucleation portion 507-1, and the liners 407 may be formed on the second recess R2 with a procedure similar to that illustrated in FIGS. 6 to 8, and descriptions thereof are not repeated herein.

Figure 34:
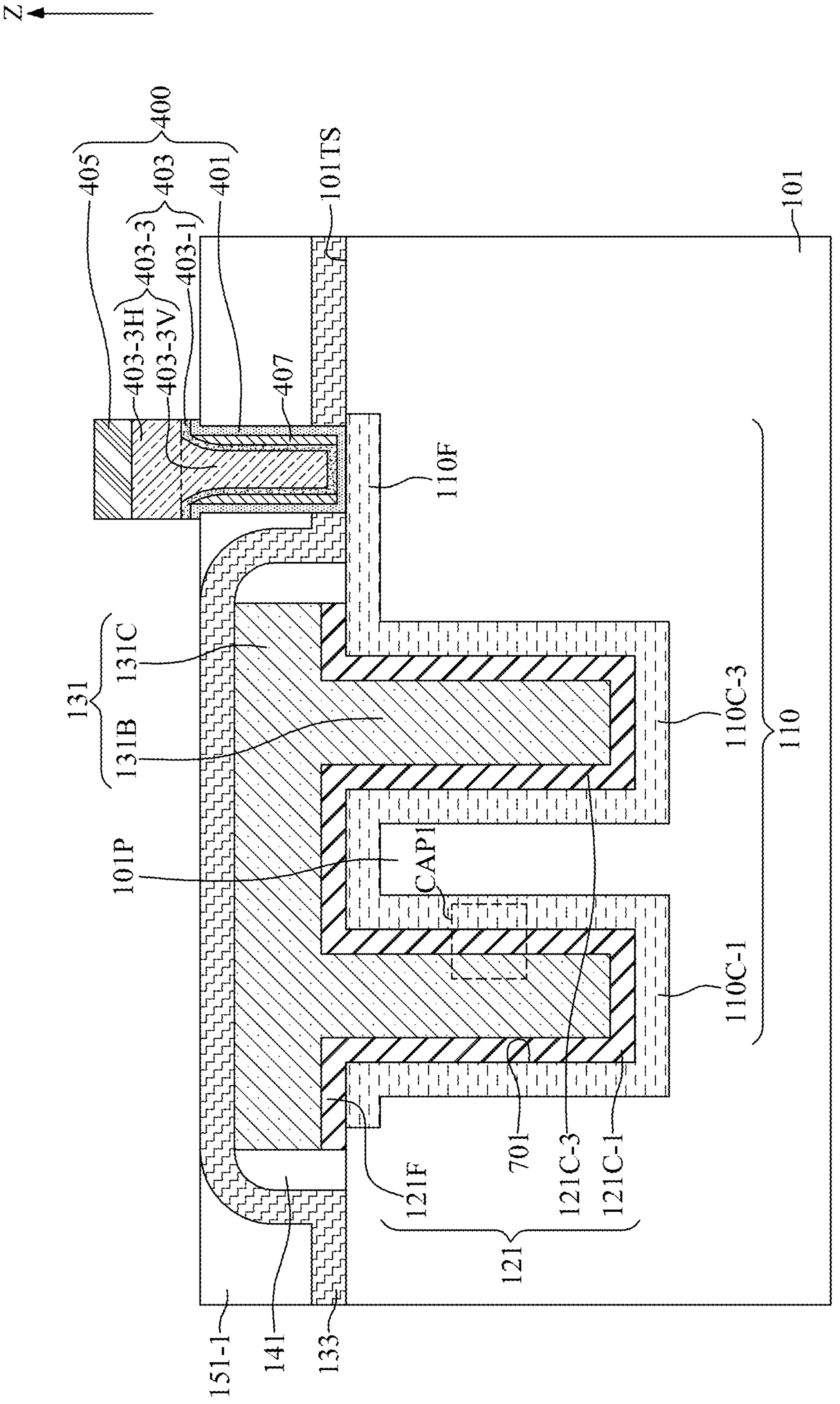

With reference to FIG. 34, the barrier layer 401, the conductive layer 403 and the hard mask layer 405 may be formed with a procedure similar to that illustrated in FIGS. 9 to 11, and descriptions thereof are not repeated herein.

Figure 35:
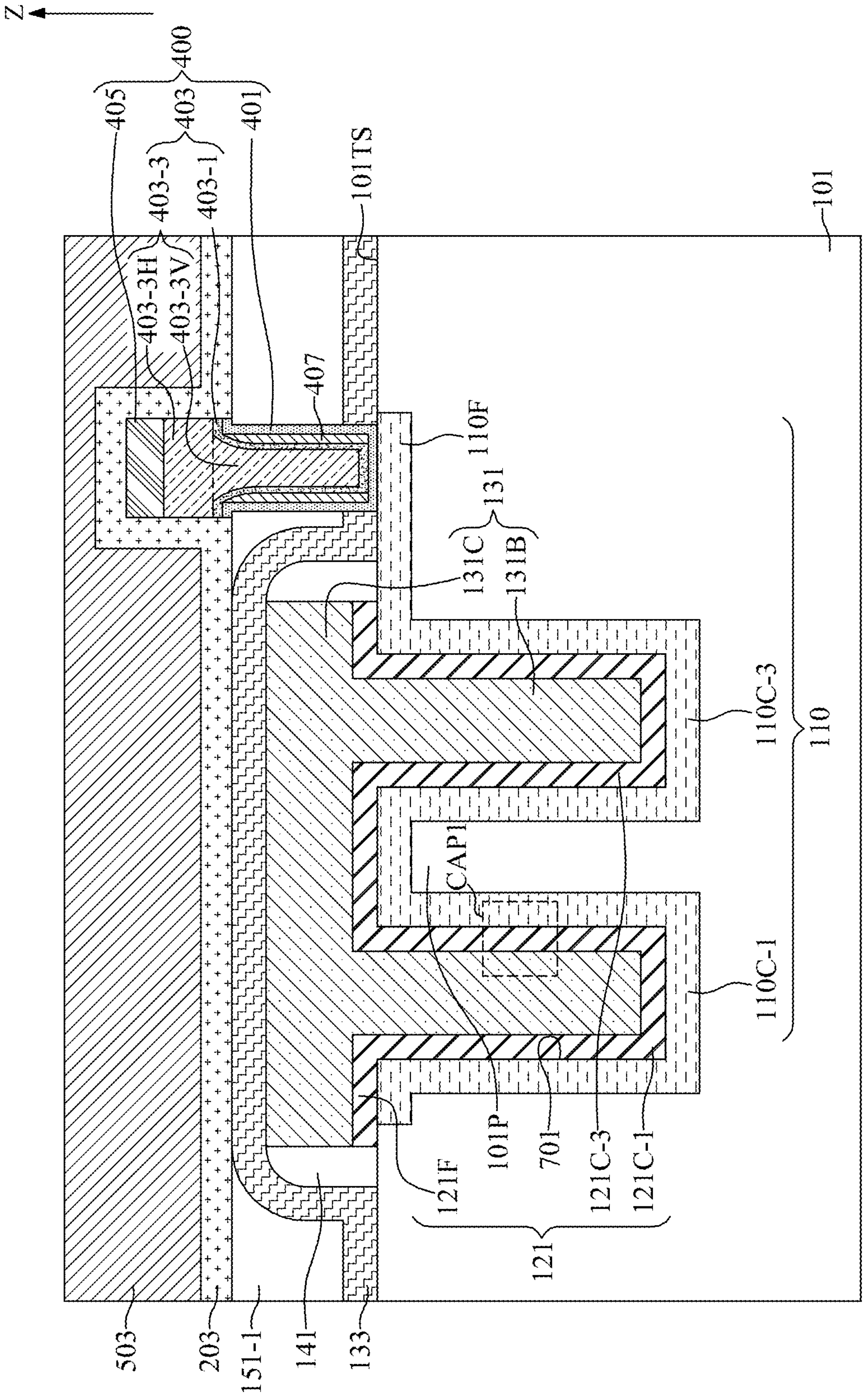

With reference to FIG. 35, the top glue layer 203 may be formed covering the inter-layer dielectric 151-1, the second insulating layer 133, and the interconnector structure 400. The top energy-removable layer 503 may be formed on the top glue layer 203. The top glue layer 203 and the top energy-removable layer 503 may be formed with a procedure similar to that illustrated in FIGS. 12 and 13, and descriptions thereof are not repeated herein.

Figure 36:
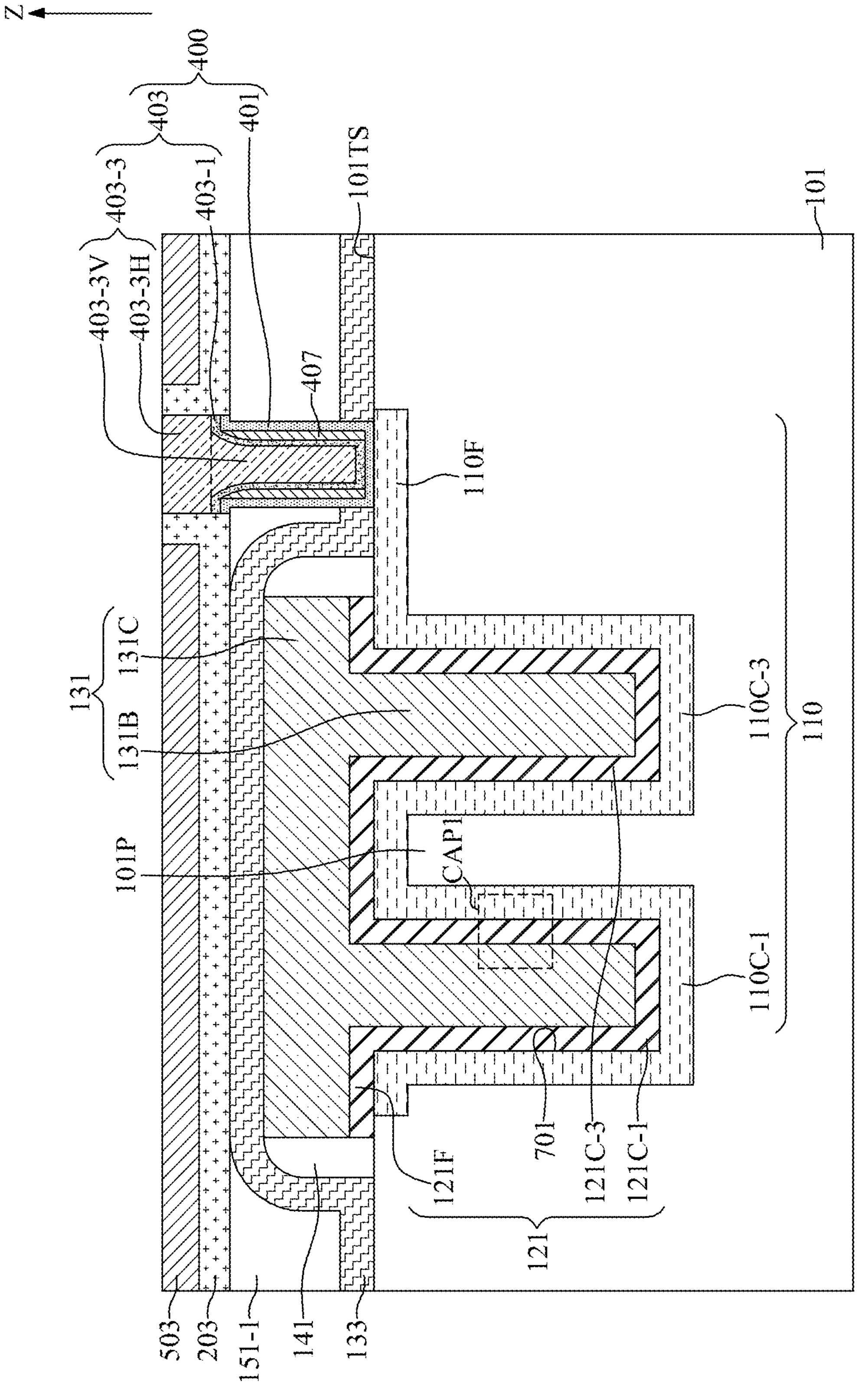

With reference to FIG. 36, the planarization process, such as chemical mechanical polishing, may be performed until the horizontal segment 403-3H of the interconnector structure 400 is exposed to remove excess material and provide a substantially flat surface for subsequent processing steps. The hard mask layer 405 may be removed during the planarization process.

With reference to FIG. 20 and FIGS. 37 to 40, at step S33, a top conductive layer 135 may be formed on the second insulating layer 133 and an energy treatment may be performed to turn the top energy-removable layer 503 into a top dielectric layer 303.

Figure 37:
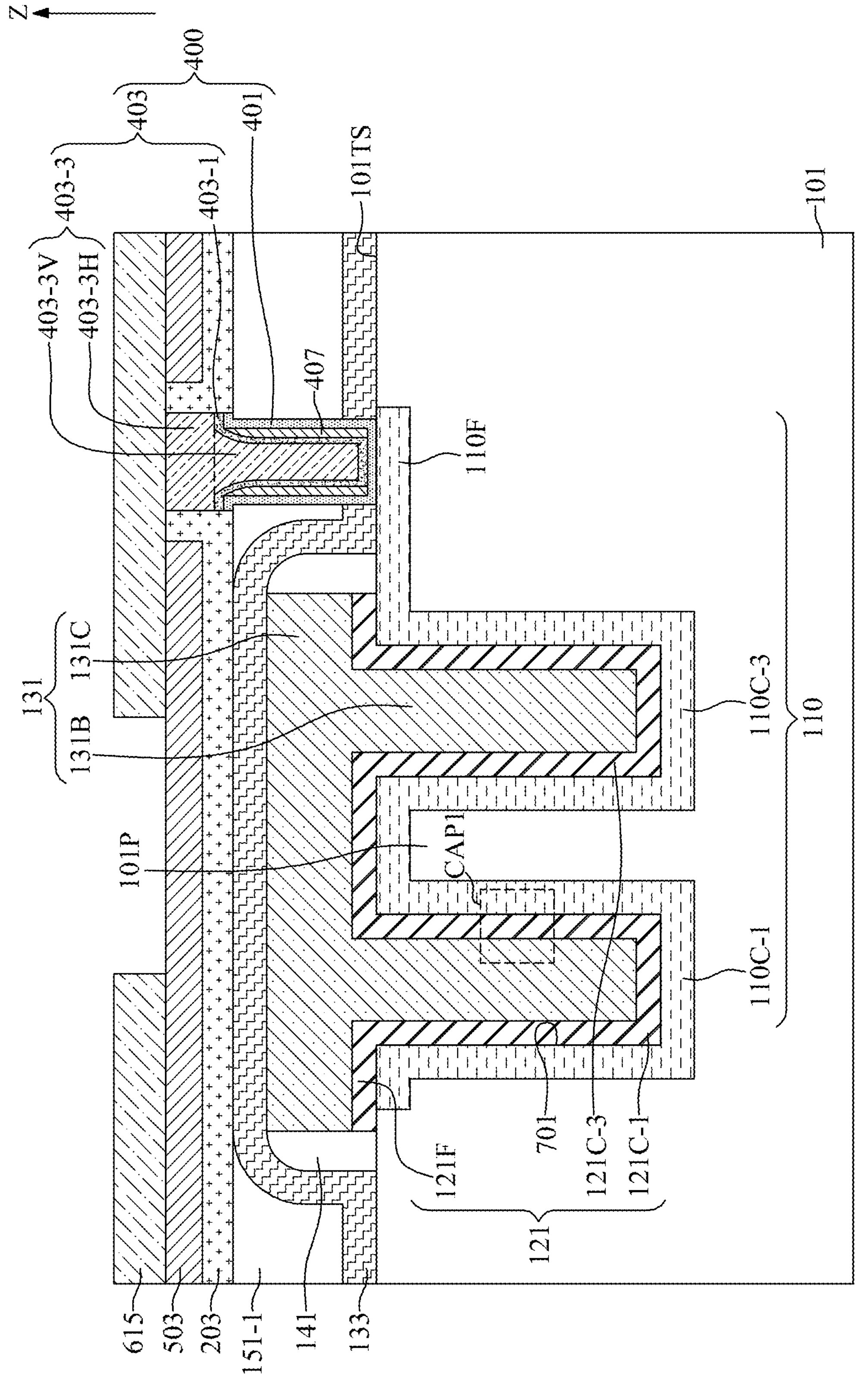

With reference to FIG. 37, a fifth mask layer 615 may be formed on the top energy-removable layer 503 and cover the horizontal segment 403-3H of the interconnector structure 400.

Figure 38:
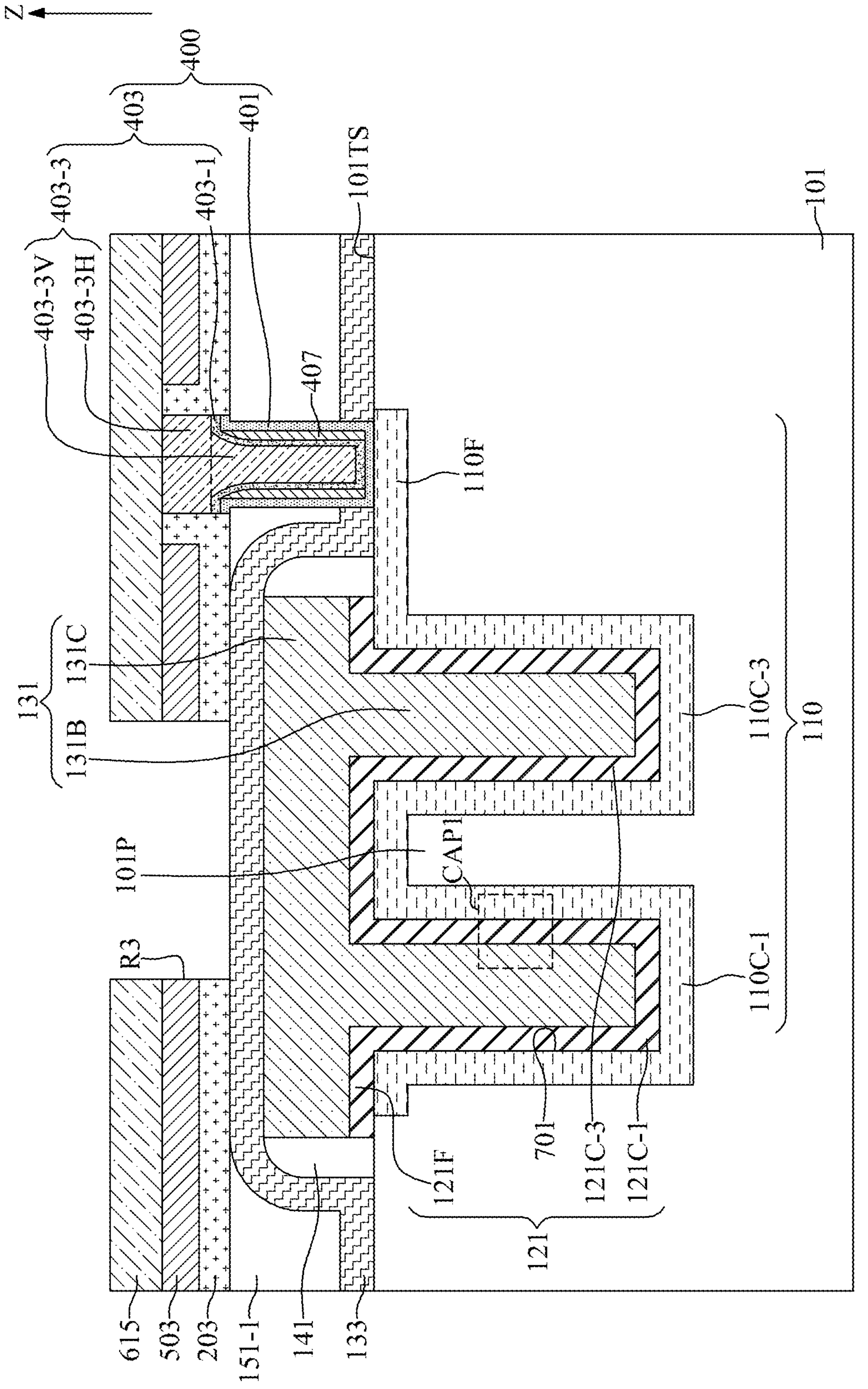

With reference to FIG. 38, an etching process, such as an anisotropic dry etching process, may be performed to remove portions of the top energy-removable layer 503 and the top glue layer 203. The third recess R3 may be formed after the etching process and the second insulating layer 133 may be exposed through the third recess R3. After the formation of the third recess R3, the fifth mask layer 615 may be removed.

Figure 39:
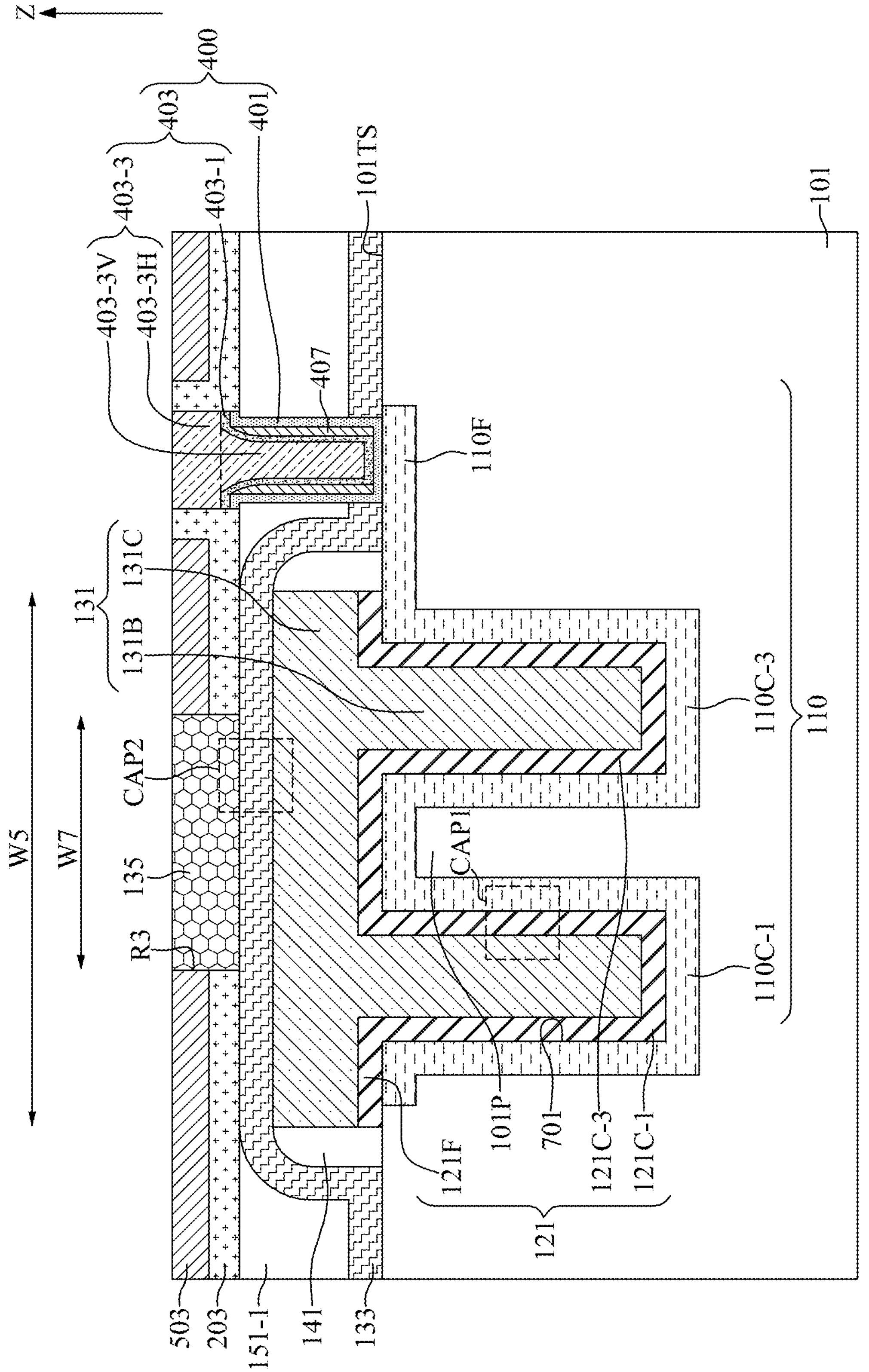

With reference to FIG. 39, the top conductive layer 135 may be formed in the third recess R3 and on the first insulating layer 121. A width W7 of the top conductive layer 135 may be less than a width W5 of the shared conductive layer 131. In some embodiments, the top conductive layer 135 may be formed of, for example, polycrystalline silicon, doped polycrystalline silicon, polycrystalline silicon germanium, doped polycrystalline silicon germanium, aluminum, copper, platinum, gold, titanium, titanium nitride, tantalum, tantalum nitride, tungsten, tungsten nitride, or alloy of gold and copper. For example, the top conductive layer 135 may be formed of copper and may be formed by a damascene process. In some embodiments, the top conductive layer 135 may be formed of the same material as the shared conductive layer 131.

With reference to FIG. 39, the top conductive layer 135, the second insulating layer 133, and the shared conductive layer 131 together configure a second capacitor unit CAP2.

Figure 40:
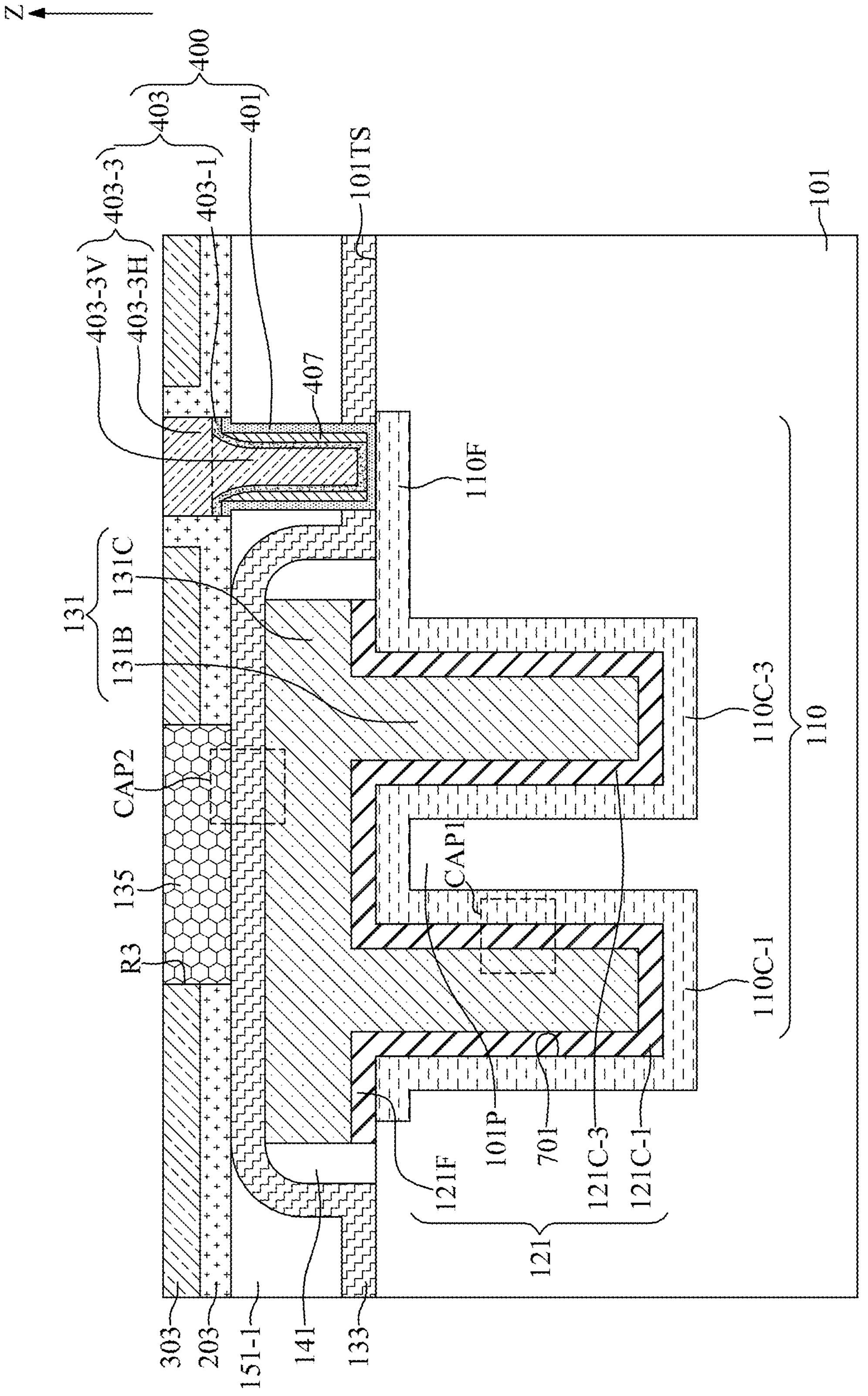

With reference to FIG. 40, the energy treatment may be performed to turn the top energy-removable layer 503 into the top dielectric layer 303 with a procedure similar to that illustrated in FIG. 18, and descriptions thereof are not repeated herein.

Figure 41:
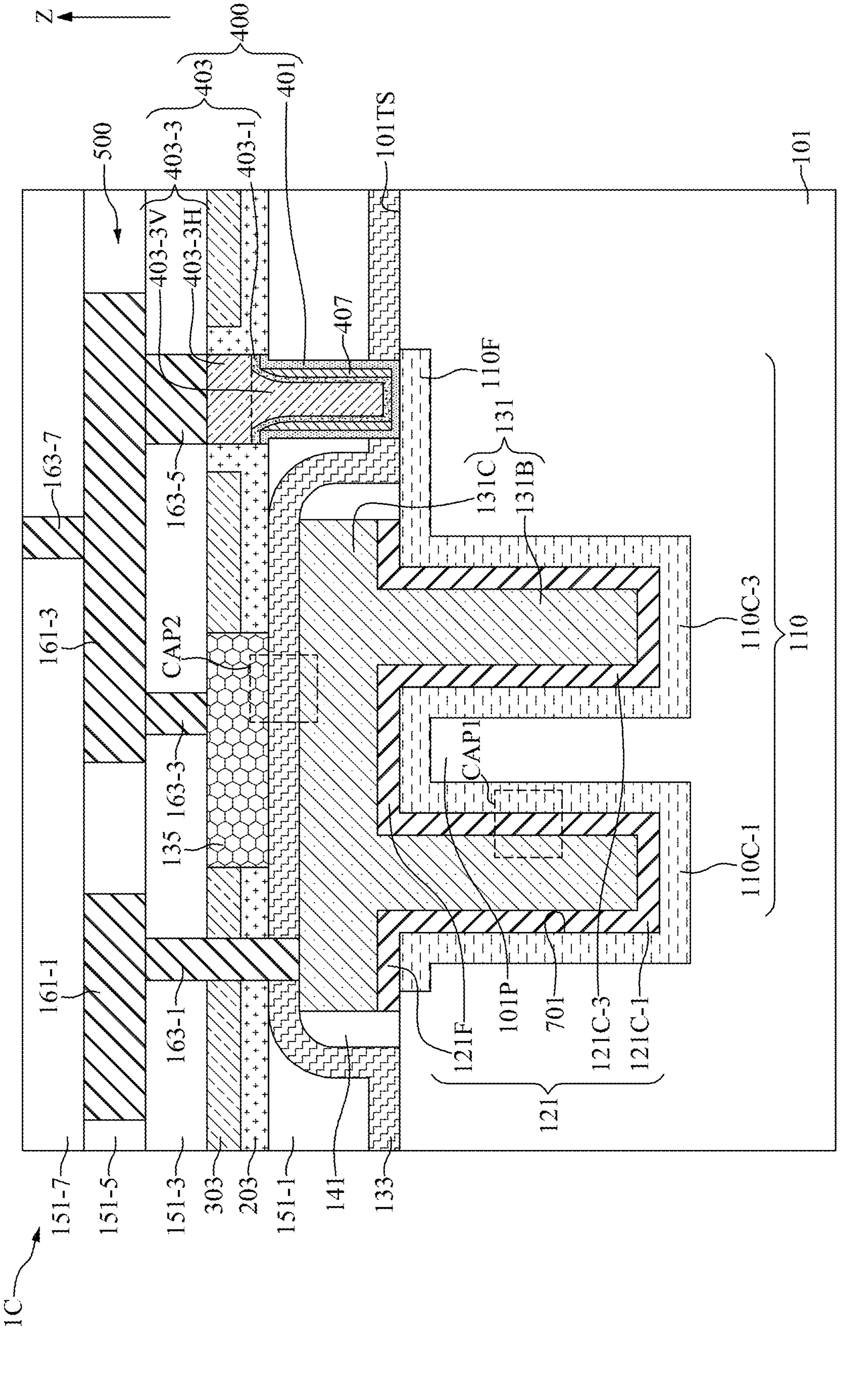

With reference to FIGS. 20 and 41, at step S35, a connection structure 500 may be formed to electrically couple the bottom conductive structure 110 and the top conductive layer 135.

With reference to FIG. 41, inter-layer dielectrics 151-3, 151-5, 151-7 may be sequentially formed on the top dielectric layer 303. In some embodiments, the inter-layer dielectrics 151-3, 151-5, 151-7 may be formed of, for example, silicon oxide, borophosphosilicate glass, undoped silicate glass, fluorinated silicate glass, low-k dielectric materials, the like, or a combination thereof. The connection structure 500 may be formed during the formation of the inter-layer dielectrics 151-3, 151-5, 151-7 by damascene processes.

In some embodiments, the connection structure 500 may include conductive lines 161-1, 161-3 and conductive vias 163-1, 163-3, 163-5, 163-7. The conductive lines 161-1, 161-3 may be formed above the top dielectric layer 303 and may be horizontally disposed. The conductive via 163-1 may be formed electrically connecting the conductive line 161-1 and the shared conductive layer 131. The conductive via 163-3 may be formed electrically connecting the conductive line 161-3 and the top conductive layer 135. The conductive via 163-5 may be formed electrically connecting the conductive line 161-3 and the interconnector structure 400. The conductive via 163-7 may be formed on the conductive line 161-3.

In some embodiments, the conductive lines 161-1, 161-3 and the conductive vias 163-1, 163-3, 163-5, 163-7 may be formed of, for example, conductive metal nitride (e.g., titanium nitride or tantalum nitride) or metal (e.g., titanium, tantalum, tungsten, copper, or aluminum).

With reference to FIG. 41, the first capacitor unit CAP1 and the second capacitor unit CAP2 may be stacked together and may be electrically coupled in parallel by the connection structure 500 to increase the capacitance density. Accordingly, the effective capacitance of the semiconductor device 1C may be increased. As a result, the performance of the semiconductor device 1C may be improved.

One aspect of the present disclosure provides a semiconductor device including a substrate; a bottom interconnector layer positioned in the substrate; a bottom dielectric layer positioned on the substrate; an interconnector structure positioned along the bottom dielectric layer, positioned on the bottom interconnector layer, and positioned on the bottom dielectric layer; a plurality of liners laterally positioned between the bottom dielectric layer and the interconnector structure and vertically positioned between the interconnector structure and the bottom interconnector layer; a top glue layer conformally positioned on the bottom dielectric layer and the interconnector structure; a top dielectric layer positioned surrounding the top glue layer. A top surface of the top glue layer and a top surface of the top dielectric layer are substantially coplanar. The top dielectric layer is porous.

Another aspect of the present disclosure provides a semiconductor device including a substrate; a first capacitor unit including a bottom conductive structure inwardly positioned in the substrate, and a shared conductive layer positioned above the bottom conductive structure with a first insulating layer interposed therebetween; a second capacitor unit including the shared conductive layer, and a top conductive layer positioned above the shared conductive layer with a second insulating layer interposed therebetween; a top dielectric layer positioned on the second insulating layer and laterally surrounding the top conductive layer, wherein the top dielectric layer is porous; a conductive layer including a horizontal segment positioned in the top dielectric layer and a vertical segment downwardly extending from the horizontal segment towards the substrate, and electrically connecting to the bottom conductive structure; a plurality of liners laterally positioned adjacent to the vertical segment and vertically positioned between the horizontal segment and the bottom conductive structure; and a connection structure electrically connecting the conductive layer and the top conductive layer such that the first capacitor unit and the second capacitor unit are in parallel.

Another aspect of the present disclosure provides a method for fabricating a semiconductor device including providing a substrate and forming a bottom interconnector layer in the substrate; forming a bottom energy-removable layer on the substrate and forming a first recess in the bottom energy-removable layer to expose the bottom interconnector layer; forming a plurality of liners on sidewalls of the bottom energy-removable layer and within the first recess; forming an interconnector structure in the first recess and on the bottom energy-removable layer and the bottom interconnector layer; conformally forming a top glue layer on the bottom energy-removable layer and the interconnector structure; forming a top energy-removable layer laterally surrounding the top glue layer; performing an energy treatment to turn the bottom energy-removable layer into a bottom dielectric layer and turn the top energy-removable layer into a top dielectric layer. A top surface of the top glue layer and a top surface of the top dielectric layer are substantially coplanar. The top dielectric layer and the bottom dielectric layer are porous.

Due to the design of the semiconductor device of the present disclosure, the parasitic capacitance of the semiconductor device may be reduced by employing the top dielectric layer (and/or the bottom dielectric layer) having low dielectric constant. As a result, the performance of the semiconductor device may be improved. In addition, the barrier layer may prevent outgassing issues of the porous layers (i.e., the bottom dielectric layer and the top dielectric layer) to avoid the damage of the interconnector structure and to improve the reliability of the semiconductor device. Furthermore, the bottom glue layer and the top glue layer may also improve the adhesion of the bottom dielectric layer and the top dielectric layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

a substrate;

a bottom interconnector layer positioned in the substrate, wherein the bottom interconnector layer is embedded in the substate at a position that a top surface of the bottom interconnector layer is coplanar with a top surface of the substrate;

a bottom dielectric layer positioned on the substrate, wherein the bottom dielectric layer has a recess extended therethrough to partially expose the top surface of the bottom interconnector layer;

an interconnector structure positioned along the bottom dielectric layer, positioned on the bottom interconnector layer, and positioned on the bottom dielectric layer, wherein the interconnector structure is extended through the recess of the bottom dielectric layer and is in contact with the top surface of the bottom interconnector layer;

a plurality of liners laterally positioned between the bottom dielectric layer and the interconnector structure and vertically positioned between the interconnector structure and the bottom interconnector layer;

a top glue layer conformally positioned on the bottom dielectric layer and the interconnector structure; and a top dielectric layer positioned surrounding the top glue layer;

wherein a top surface of the top glue layer and a top surface of the top dielectric layer are substantially coplanar;

wherein the top dielectric layer is porous;

wherein the interconnector structure comprises a conductive layer comprising:

a vertical segment extended into the recess of the bottom dielectric layer; and a horizontal segment positioned on the vertical segment and on the bottom dielectric layer;

wherein the top glue layer is conformally formed on a top surface of the bottom dielectric layer and a side surface of the horizontal segment of the conductive layer of the interconnector structure, and is formed above a top surface of the horizontal segment of the conductive layer of the interconnector structure.

2. The semiconductor device of claim 1, wherein the bottom dielectric layer is porous.

3. The semiconductor device of claim 2, wherein a porosity of the top dielectric layer is greater than a porosity of the bottom dielectric layer.

4. The semiconductor device of claim 3, wherein the porosity of the bottom dielectric layer is greater than a porosity of the top glue layer.

5. The semiconductor device of claim 4, further comprising a bottom glue layer positioned between the substrate and the bottom dielectric layer, wherein the bottom glue layer and the top glue layer comprise the same material;

wherein the recess is further extended through the bottom glue layer to partially expose the top surface of the bottom dielectric layer;

wherein the bottom glue layer is formed on the top surface of the substrate to partially cover the top surface of the bottom dielectric layer.

6. The semiconductor device of claim 5, wherein the plurality of liners are laterally positioned between the vertical segment and the bottom dielectric layer and vertically positioned between the horizontal segment and the bottom interconnector layer.

7. The semiconductor device of claim 6, wherein a width of the horizontal segment is greater than a width of the vertical segment.

8. The semiconductor device of claim 7, further comprising a hard mask layer positioned on the horizontal segment, wherein the top glue layer conformally covers the hard mask layer;

wherein the top glue layer is conformally formed on a top surface and a side surface of the hard mask layer.

9. The semiconductor device of claim 8, wherein a width of the hard mask layer and the width of the horizontal segment are substantially the same.

10. The semiconductor device of claim 9, further comprising a barrier layer positioned between the horizontal segment and the bottom dielectric layer, between the plurality of liners and the bottom dielectric layer, and between the vertical segment and the bottom interconnector layer;

wherein a thickness of the top glue layer is greater than a thickness of the barrier layer.

11. The semiconductor device of claim 10, wherein the conductive layer comprises a nucleation portion positioned between the horizontal segment and the barrier layer, between the vertical segment and the plurality of liners, and between the vertical segment and the barrier layer.

12. The semiconductor device of claim 10, wherein the porosity of the top glue layer is less than 5%.

13. The semiconductor device of claim 10, wherein the porosity of the top dielectric layer is greater than 50%.

14. The semiconductor device of claim 10, wherein the porosity of the bottom dielectric layer is between 20% and 50%.

15. The semiconductor device of claim 10, wherein the conductive layer comprises tungsten, copper, aluminum, or a combination thereof.

16. The semiconductor device of claim 10, wherein the plurality of liners comprise titanium, titanium nitride, titanium-tungsten alloy, tantalum, tantalum nitride, or the combination thereof.

* * * * *